United States Patent [19]

Hansen

[11] Patent Number: 5,369,470
[45] Date of Patent: * Nov. 29, 1994

[54] FM RECEIVER WHICH DETECTS AND RESPONDS TO RECEIVING AND INTERFERENCE STATES

[75] Inventor: Jens Hansen, Berlin, Germany

[73] Assignee: H.u.C. Elektronik GmbH, Berlin, Germany

[ * ] Notice: The portion of the term of this patent subsequent to Aug. 31, 2000 has been disclaimed.

[21] Appl. No.: 601,743

[22] PCT Filed: May 30, 1989

[86] PCT No.: PCT/DE89/00359

§ 371 Date: Oct. 31, 1990

§ 102(e) Date: Oct. 31, 1990

[87] PCT Pub. No.: WO89/12355

PCT Pub. Date: Dec. 14, 1989

[30] Foreign Application Priority Data

May 30, 1988 [DE] Germany .............................. 3818749

[51] Int. Cl.$^5$ ............................................. H04B 1/16
[52] U.S. Cl. .................... 455/296; 455/266; 455/306; 455/339
[58] Field of Search ............... 455/200.1, 266, 295, 455/296, 339, 306–308, 312, 340, 213, 221, 222, 225

[56] References Cited

U.S. PATENT DOCUMENTS 2,282,974  5/1942  Koch .
(List continued on next page.)

FOREIGN PATENT DOCUMENTS

| 0075071 | 3/1983 | European Pat. Off. . |
| 0086838 | 8/1983 | European Pat. Off. . |
| 8121986 | 6/1982 | France . |
| 2731940 | 1/1978 | Germany . |
| 2929647 | 2/1981 | Germany . |
| 3131292 | 5/1982 | Germany . |
| 3438286 | 4/1986 | Germany . |
| 0177030 | 8/1986 | Japan .................. 455/266 |
| 8602505 | 4/1986 | WIPO . |
| 8808222 | 10/1988 | WIPO . |
| 8808223 | 10/1988 | WIPO . |

OTHER PUBLICATIONS

Inoue et al, "An Advanced and Intelligent Reception System for FM Stereo Receiver," IEEE Transactions on Consumer Electronics (1984), pp. 251-258.

Primary Examiner—Reinhard J. Eisenzopf
Assistant Examiner—Chi Pham
Attorney, Agent, or Firm—Spencer, Frank & Schneider

[57] ABSTRACT

An FM receiver includes an IF unit followed by an LF unit, the IF unit having an IF filter arrangement. The center frequency of the IF filter arrangement, which is relatively narrow-banded with respect to the channel bandwidth, is controlled in dependence on the receiving conditions. The receiver has circuitry for changing the signal transmission characteristic of the IF and/or LF units, including a detector module with detector circuits for detecting values characteristic of receiving or interference states, with the inputs of said circuits each being connected with a circuit point of the IF or LF unit carrying the signal to be processed, and with the outputs of these circuits providing signals characterizing receiving and interference states. The circuitry for changing the signal transmission characteristic also includes an evaluation circuit for processing the signals characteristic of receiving or interference states, the evaluation circuit having an input portion with at least one amplitude and/or time threshold circuit connected with the detector module and having a logic unit which is connected to the input portion and which provides processed signals characteristic of receiving and interference states as control signals to influence the individual stages of the IF or LF unit.

29 Claims, 15 Drawing Sheets

U.S. PATENT DOCUMENTS

| | | | |
|---|---|---|---|
| 3,231,822 | 1/1966 | Tillotson. | |
| 4,081,771 | 3/1978 | Hendrickson | 334/15 |
| 4,117,406 | 9/1978 | Takahashi et al. . | |
| 4,192,970 | 3/1980 | Kahn | 455/307 |
| 4,247,952 | 1/1981 | Shibuya | 455/186 |
| 4,267,605 | 5/1981 | Matsozawa | 455/266 |
| 4,352,208 | 9/1982 | Schroeder | 455/266 |
| 4,356,567 | 10/1982 | Eguchi et al. | 455/177 |
| 4,385,402 | 5/1983 | Barrs | 455/339 |
| 4,388,731 | 6/1983 | King | 455/221 |
| 4,406,019 | 9/1983 | Ide et al. | 455/266 |
| 4,458,207 | 7/1984 | Favreau et al. | 455/266 |
| 4,525,868 | 6/1985 | Kage et al. | 455/206 |
| 4,531,148 | 7/1985 | Ohta et al. | 455/340 |
| 4,563,651 | 1/1986 | Ohta et al. | 329/110 |
| 4,598,426 | 7/1986 | Shiojima | 455/266 |
| 4,654,884 | 3/1987 | Sakai et al. | 455/200 |
| 4,658,438 | 4/1987 | Kamata et al. | 455/264 |
| 4,718,116 | 1/1988 | Jacobs et al. | 455/266 |
| 4,761,829 | 8/1988 | Lynk, Jr. et al. | 455/307 |
| 4,812,851 | 3/1989 | Giubardo | 342/389 |

Fig. 2

| | (B) LINEAR COMPONENT ON | (L) BANDPASS FILTER ATTENUATED I | (A) BANDPASS FILTER ATTENUATED II | (C) SINGLE TUNED CIRCUIT COMPONENT ON | (D) SINGLE TUNED CIRCUIT ATTENUATED | (E) Mono | (J) ADJACENT CHANNEL LEVEL RAISED |
|---|---|---|---|---|---|---|---|
| I. NORMAL RECEPTION ($NK_0'$) | X | X | X | | | | |
| II. $NK_1'$ | X | | X | X | X | | X |
| III. $NK_2'$ | X | | | X | X | | |
| IV. WEAK SIGNAL | X | | | X | | ($\bar{X}$) | |
| V. $NK_3'$ | | | | X | | | |
| VI. REFLECTIONS | | | | | | X | |

200

| | FREQUENCY RESPONSE SWITCHING (B) | PHASE MOD. ON (K) | FILTER FOLLOW-UP OFF (F) |
|---|---|---|---|
| I. NORMAL RECEPTION | | | |
| II. NK₁' | | | |
| III. NK₂' | | X | |
| IV. WEAK SIGNAL | | X | |
| V. NK₃' | X | X | |
| VII.I ADJACENT CHANNEL TAKEOVER | | | X |

Fig. 8a) ─────────────────────────
Fig. 8b) ─────────────────────────
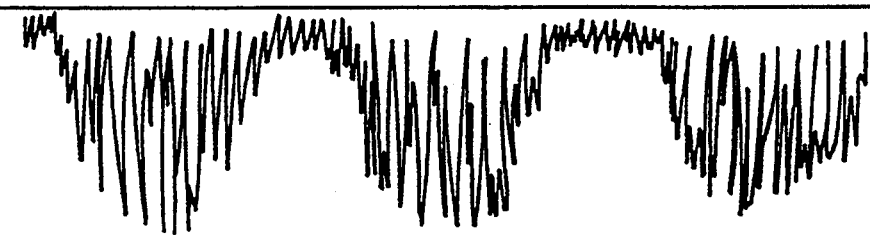
Fig. 8c) ─────────────────────────
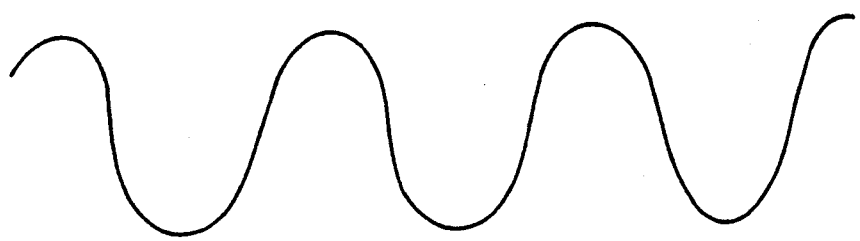

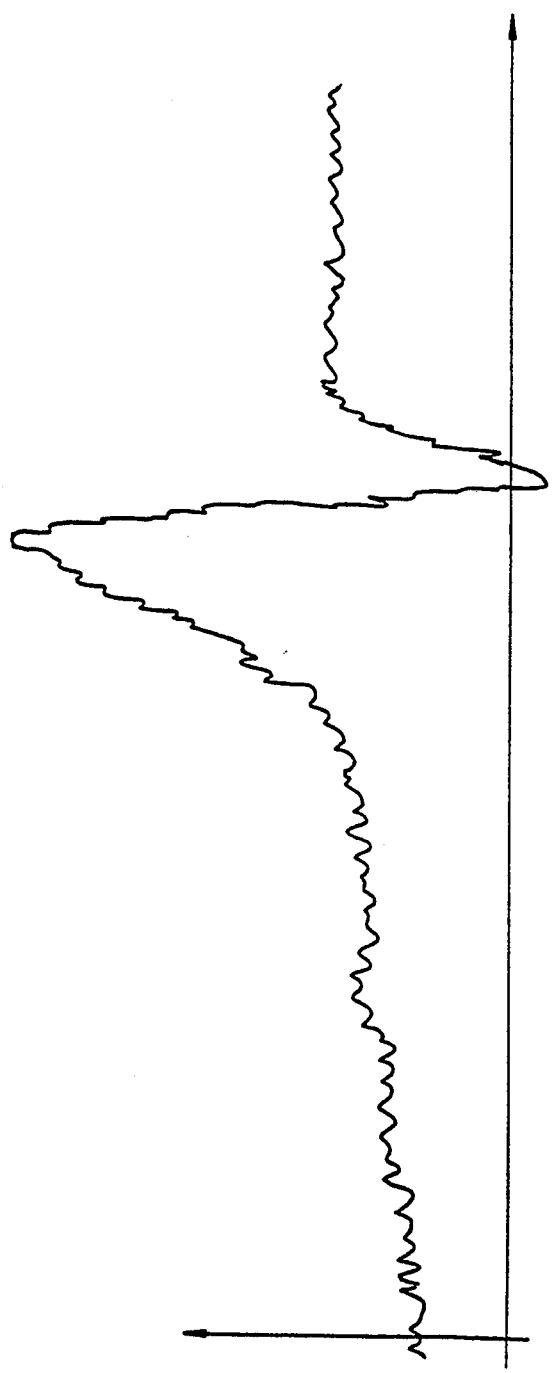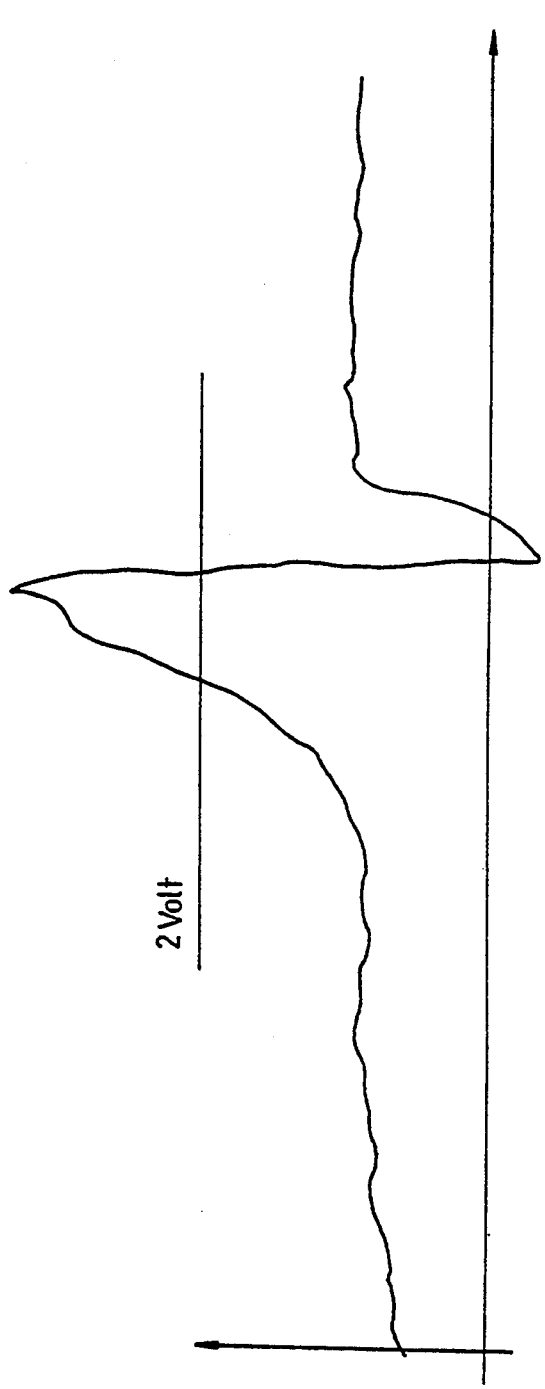

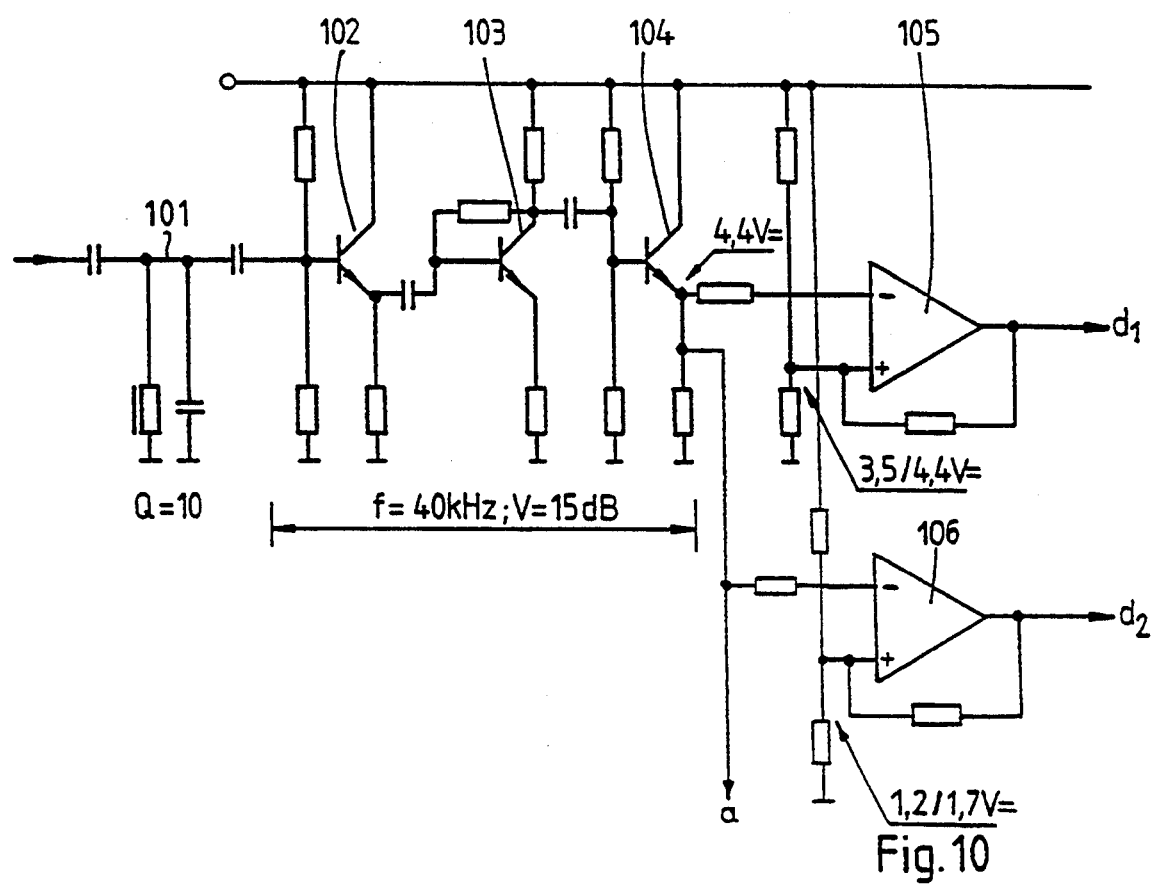

FM RECEIVER WHICH DETECTS AND RESPONDS TO RECEIVING AND INTERFERENCE STATES

BACKGROUND OF THE INVENTION

The invention relates to an FM receiver of the type including means for controlling the center frequency of an IF filter, which is relatively narrow-banded with respect to the channel bandwidth, in dependence on the desired modulation, and a signal processing unit comprising an IF unit and an LF unit for amplifying, frequency converting and demodulating the received FM signal.

Circuits of this type are disclosed in DE-A 3,147,493 and DE-A 3,438,286, EP-A 0,075,071 or FR-A 8,121,986, all originating from Jens Hansen as the inventor.

The performance capability of conventional VHF receivers is hardly able to handle present-day difficult receiving conditions. The dense occupation with stations creates a "spectral sump" which clearly shows the limits of receiver design regarding receiving sensitivity and selectivity. The dilemma of VHF reception is that the spectrum of a frequency modulated signal has no defined limits but runs out slowly and thus, inevitably, in spite of all limitation measures at the transmitter, projects into the adjacent channels. Even a medium field intensity stereo transmitter noticeably reduces the threshold sensitivity of its adjacent stations. If now, as in mobile operation, receiving conditions change constantly, increased noise, takeover of modulation, and reflection distortions are the unavoidable result.

Conventional filter technology cannot help here because the spectral lines of noise within the receiving channel can no longer be selected. Although contraction of the bandwidth to reduce multipath interferences would bring part of the noise spectrum outside of the filter, it would also bring part of the useful spectrum outside of the filter, so that the receiving sensitivity would be reduced.

In the known methods for processing FM signals in the IF domain described in the above-mentioned references, controllable, narrowband filters are employed. These narrowband filters, whose resonance position is controllable, perform at the same rhythm as the IF signal to be selected; thus they follow the momentary IF so that a selection is made at every moment precisely where a selection happens to be required. Due to the narrowbandedness of the employed filters, sensitivity and selectivity are increased considerably.

The control voltage for the resonant frequency of the filters is derived from the low frequency, whose level is a sufficient measure for the position of the momentary IF. However, for reasons of principle, this position indication cannot be accurate since, in order to control the filters, the IF must first pass through them and must then be demodulated. Thus, any control always takes place with a certain delay which is essentially given by the group delay of the filters. The more narrowband the filters are designed, the higher is their group delay. In simple tracking filter methods or in the known PLL or synchronous methods, this follow-up delay would have the result, in the higher low-frequency range, that the movement of the IF signal and that of the filter would go in opposite directions. Pulling of the filters in the lower LF range would be opposed by pushing in the upper LF range so that ultimately broadband transmission would be impossible.

SUMMARY OF THE INVENTION

It is thus the object of the invention to considerably increase the receiving sensitivity and the selectivity without adversely affecting other receiver data, such as the distortion factor, stereo crosstalk or LF frequency response.

This object is accomplished by an FM receiver of the type including means for controlling the center frequency of an IF filter, which is relatively narrow-banded with respect to the channel bandwidth, in dependence on the desired modulation, and a signal processing unit comprising an IF unit and an LF unit for amplifying, frequency converting and demodulating the received FM signal, which receiver is characterized by a circuit for changing the signal transmission characteristic of the IF and/or LF units, with this circuit comprising a signal detection unit including circuits for detecting values characteristic of receiving or interference states, these circuits each having inputs connected with a circuit point of the IF or LF unit carrying the signal to be processed, and outputs for signals characterizing receiving and interference states, respectively;

a signal output unit for putting out the processed signals characteristic of receiving an interference states, respectively, as control signals to influence the processing characteristic of the signal processing unit to individual stages of the IF or LF unit, with inputs of the signal output unit being connected with outputs of the signal processing unit and with the outputs of the signal output unit being connected with control inputs of states of the IF and LF unit, respectively, and a timer circuit which only releases a clearing signal for the culmination of the control signal transmission if the signal has no interference for a minimum time-span.

The invention is based on the realization that it is advantageous to prevent receivers which can adjust to changing reception conditions from changing too often from one operational condition to another as a single switching process is not noticed by the user but numerous switching processes can lead to fluttering or oscillations.

Because, in accordance with the invention, an undisturbed signal must exist for a predetermined time-span before the switch-back process occurs it is guaranteed that the frequency of the interferences diminish and that interferences will very probably not occur any more.

The probability increases with the length of the time-span chosen to delay the switch-back process. Here one must make a compromise between the expected frequency of the switching processes and the time to switch-back after the removal of the interference.

According to an advantageous feature a timing device is chosen for numerous switching signals which are induced by differing interference types.

This advantageous feature is based on the realization that when constructing the control circuits for the ICS-system utilising an integrated switch circuit, one can only use analog technology (mainly bipolar technology) due to the numerous analog components required. Digital timing devices could be installed on an IC-chip but would require a large amount of space.

The object of the invention is accomplished very advantageously in that the timing device interprets the front and back edges of a period signal and by period alternation creates two types of signal impulses which are displaced in time in relation to one another. The signal impulses are preferably obtained by differentiating the impulse edges of the output signal of an astable multivibrator. One impulse type actuates a bistable element which is switched back by another signal if there is interference. If a signal of the second impulse type occurs whilst the bistable element is still actuated, another bistable element (which is actuated if there is interference and whose actuation has been held since the beginning of the interference) is set back in order to transmit the relevant signal.

Even when processing and linking a number of interference signals, it is in this way guaranteed that the number of switching conditions is minimised as centrally controlled fixed switch times are available for the switching processes. In this way the chosen time-span with which the switch-back process is delayed can be relatively short, without too many changes in the processing characteristics disturbing the user. If the repetition time T is $T=1/f=2\tau$ for the two impulse types, with a time difference of $\tau$, then the switch-back delay after the interference has died away is between $\tau$ and T.

The invention is further based on the realization that VHF reception can be decisively improved only if, under constantly changing reception conditions, processing in the receiver changes constantly as well. According to the invention, the IF signal at the output of the conventional selection filters is not only subjected to a variable sharpness selection by filter follow-up, but the type of processing is also changed in addition. Thus, the filters not only follow the momentary IF signal with respect to their center frequency—additionally, the transmission channel adapts itself in several stages and with reference to different parameters to the momentary signal conditions which result from the respective interference due to noise. The stronger or closer a spectral noise is to the desired signal, the stricter is the selection. In particular, adaptation of the transmission channel is improved decisively in that the signals which are characteristic of the momentary receiving conditions are detected separately, preferably by means of envelope demodulation, and are then processed by amplitude and time discrimination means so that they do not themselves interfere with reception due to too frequent switching processes. Then these signals are fed as control signals to those stages which, by changing the signal transmission characteristic, counteract the interferences represented by the control signals.

A variable characteristic is preferably realized by the selective linkage of the output signals of two filter stages and their adaptable attenuation. The first filter stage is a two-section bandpass filter, and the second filter stage is composed of two series-connected individual resonant circuits which are tuned to the same frequency.

However, this type of filtering is not fixed; it changes in dependence on the receiving conditions.

The momentary reception situation is essentially characterized by:
 the position of the momentary IF;
 the level of the receiving field intensity; and
 the level of adjacent channel interferences and interferences within the desired channel.

The following detection circuits are preferably provided:
 1. for adjacent channel interferences;
 2. for adjacent channel takeover;
 3. for reflection interferences; and
 4. for the field intensity level.

By way of a logic circuit, the outputs of the detection circuits are linked to the control inputs of the filters.

Preferably, the IF filter arrangement is composed of a single-circuit prefilter at 10.7 MHz, a mixer stage for the conversion of 10.7 MHz to 700 kHz, a subsequent two-section bandpass filter and two individual circuits connected to the output of the bandpass filter and tuned to 700 kHz.

The outputs of the bandpass filter and of the single circuits are each fed by way of a switch to an adder stage whose output is connected with the demodulator. The oscillator voltage is fed to the mixer change through at least one single circuit.

In the filter arrangement, the following are controlled:
 1. the resonance position of the prefilter, the bandpass filter and the single filters in synchronism with the momentary IF;
 2. the phase position of the oscillator voltage in phase opposition with the momentary IF;
 3. the attenuation of the bandpass filter;
 4. the attenuation of the single filters; and
 5. the summation of signals from different processing paths.

In detail, advantageous controls take place as follows.

The control voltages for the resonance position of the filters are derived from the LF signal, whose level is a measure for the frequency position of the momentary IF signal. However, this position indication includes a slight error because, before the filters are controlled, the IF must first have passed through them and must then be demodulated. Thus, the control voltage is not available at the same time to make a change in the IF but only after a certain delay which is determined essentially by the group delay of the filters.

The more narrowbanded the filters are designed, the higher is their group delay. The phase error produced by this delay of the control voltage relative to the IF signal movement grows with the rapidity of the change in the IF signal and, in simple pull or tracking filter arrangements (even in the PLL or synchronous methods) would result in the filters not pulling in synchronism with the momentary IF signal in the higher LF frequency range, but pushing asynchronously in the opposite direction. With a total bandwidth of about 20 kHz employed here, the point of reversal between the push and pull ranges would lie at about 6 kHz.

Correct pulling of the arrangement over the entire LF range is preferably realized by the following measures:

1. the frequency response for the control voltage of the narrowbanded single filters provides for a slight rise in height. The phase lead created by this highpass characteristic in part compensates for the phase delay of the control voltage caused by the group delay of the filters.

2. The addition of the transmission curves of the bandpass filter to that of the single filter results in a filter characteristic in which the filter edges have the customary LC resonant circuit characteristic in the resonance range; but after a drop of about 8 dB, they change to a flatter, descending curve which corresponds to the bandpass filter. Such a characteristic increases the follow-up capability in the higher LF range compared to a filter characteristic which has a continuous single circuit characteristic.

3. The remaining phase error causes a relative movement in the higher LF range between the IF signal and the filters. This results in a phase interference modulation which is eliminated in that a phase modulator gives the IF signal a modulation in phase opposition to this interference modulation so that the interference modulation and thus also the phase error between the momentary IF signal and the movement of the filters is substantially compensated.

The resonance position of the filter arrangement is essentially controlled in dependence on the momentary IF signal, that is, independently of other receiving conditions such as magnitude of the level of the desired channel or the adjacent channel. However, the transmission characteristic is dependent upon these values, not, however, on the position of the momentary IF signal.

The stronger the multipath reception (essentially the adjacent channel reception), that is, the higher the requirement for selectivity, the more narrowbanded becomes the transmission characteristic of the filters controlled in their resonance position.

It is a significant fact for the invention that with the controlled IF signal, in particular, a signal is available which, in spite of an integratingly acting regulator, contains in its amplitude fluctuations, in addition to the desired signal, the decisive informations for the purpose of producing switching signals to change the processing channel so as to obtain a desired signal that is as little interfered with as possible. These information components are changed relatively little by the switching actions to be initiated so that they constitute a neutral reference for signal processing.

According to advantageous features, the signals characteristic of certain interferences with reception are detected and output signals are derived therefrom by signal linkages so as to initiate individual—or a series of—countermeasures during processing in the communications channel in order to optimally counteract the respective reception interference.

According to an advantageous modification of the invention, the limit of the use of controls during the regulation of the IF signal is utilized as a criterion for a critical limit of the receiving field intensity.

Although the filter follow-up also involves amplitude contractions and the desired FM signal also leads to amplitude modulation, the two information components which determine the processing characteristic—for filter follow-up on the one hand and the adaptation of the type of filtering on the other hand—hardly influence one another so that an overall effective system behavior is obtained without uncontrollable mutual influences of regulating and control values.

It is further of particular advantage that the signals determining the processing characteristic are derived essentially uniformly from amplitude fluctuations of the IF. Thus, the relationship of the desired channel station to the adjacent channel station is detected by amplitude modulation at the IF generated by the interference between the station in the desired channel and the station in the adjacent channel, with the IF being controlled to a fixed voltage value.

This serves, in a favorable manner, to detect the ratio between the signal levels of both stations. If the desired field intensity rises to twice its value, with the adjacent channel field intensity remaining constant, the level of the IF, if it were not regulated, would double, but the amplitude modulation by the interference would remain constant. With a regulated amplitude, however, the amplitude remains constant and the amplitude modulation goes back to half its value corresponding to the ratio of desired channel field intensity to adjacent channel field intensity.

In this way, adjacent channel interferences and all effects influencing amplitude modulation can be proven to lie uniformly within the control loop.

Thus, reflection interferences, similar to adjacent channel interferences, are detected by the amplitude modulation they produce in the IF. The superposition of several modes in different phase positions results in amplitude contractions of the IF whose envelope has a broadband LF spectrum. Since the desired modulation also leads to a slight amplitude modulation at the IF, reflection is detected in that a frequency range which is contained only to a light percentage in the MPX signal is filtered out of the spectrum of the IF envelope. This frequency range lies between 20 and 30 kHz. The output voltage of the filter stage employed for this purpose (attenuated LC resonant circuit) is fed to a threshold switch which emits an unequivocal detection signal.

The invention is further based on the realization that in a balanced FM receiving system, any adverse influences on the audio signal produced by reception interference must be reduced to the extent that it is less noticeable in any case in the audible LF signal than corresponds to its influence on the HF signal. This philosophy is represented by an always optimum adaptation of the IF and LF transmission channels to the characteristics of the interfered with HF signal to utilize in this way to the greatest possible extent its uninterfered with components and to reduce the effects of unavoidable interfering influences which penetrate to the LF signal as much as possible.

Before the various transmission curves are discussed, the basic principle of the detections will be described:

Adacent Channel Detection

Adjacent channel interferences are detected by the interference that an adjacent channel gives the desired signal. For this purpose, the IF signal is rectified and fed via a highpass filter with subsequent amplifier to threshold switches at whose outputs the detection signal is present. Adjacent channel interferences are detected in several stages of intensity.

An important factor for the detection of adjacent channel reception is the detection not of the absolute value of the adjacent channel station but the relationship of the desired channel field intensity to the adjacent channel field intensity because it alone is decisive for the detection of adjacent channel interferences.

The relationship between the desired channel station and the adjacent channel station is detected by the amplitude modulation at the IF which occurs due to interference between the desired channel station and the adjacent channel station, with the IF being regulated to a fixed voltage value.

In an advantageous manner, the relationship between the signal levels of the two stations is detected here. If, for example, the desired field intensity rises to twice its value with the adjacent channel field intensity remaining constant, the level of the IF would double if it were not regulated, but the amplitude modulation by the interference would remain constant. With a regulated amplitude, however, the amplitude remains constant and the amplitude modulation is reduced to one-half its value corresponding to the ratio of the desired channel field intensity to the adjacent channel field intensity.

In detail, adjacent channel detection preferably takes place as follows: initially, the IF is amplitude modulated, then the interference signal is separated by means of a two-pole highpass filter having a cut-off frequency of about 40 kHz from the remaining signals which lie at the IF as amplitude modulation. The thus filtered-out interference signal is amplified (about 40 dB) and then the envelope curve is formed by way of this signal. By way of a subsequent lowpass filter to smooth any possible noise peaks, the signal is fed in parallel to a plurality of comparators which emit detection signals as soon as the input signal exceeds their predetermined reference level.

This arrangement detects adjacent channel reception in several intensity stages. Since after reaching the first intensity stage, the filter characteristic is switched to be more narrowbanded, the adjacent channel information slightly decreases. This regression of the input value of the comparator is compensated by a corresponding rise in the reference level, i.e. by a corresponding hysteresis.

Field Intensity Detection

The IF signal is regulated to a predetermined constant voltage value by way of an integral regulation. The output signal of the integrator is here a measure for the level of the IF. This output signal is fed to a plurality of, preferably two, comparators at whose reference inputs there are present those voltage levels which correspond to the control voltage values at the antenna voltages at which switching is to occur. The output signals of the comparators (logic high/low signals) indicate the respective field intensity range in which the actual field intensity lies.

Switching of the Selection Curves

Preferably, various selection curves are distinguished, each determined by the momentary reception situation. In the sequence of selectivity, the filter arrangement is preferably switched according to the following scheme, with, however, a modified association by omitting or rearranging several signal linkage conditions in the course of processing including the signal input unit, the signal processing unit and the signal output unit still being within the scope of the invention.

$NK_0$:
bandpass filter attenuated; and
only bandpass filter channel switched through.
$NK_1$:
bandpass filter slightly attenuated; and
only the bandpass filter channel is active.
NK2:
bandpass filter de-attenuated (the term "deattenuated" here is intended to mean that the attenuation resistances to be added to the circuit are not switched in);
single circuit channel attenuated; both channels switched through.
Weak Signal (low receiving level):
bandpass filter de-attenuated;
single circuit channel de-attenuated; and
both channels switched through (mono reception).
$NK_3$:
single channel de-attenuated; and
only single circuit switched through (mono reception).

(The designations $NK_0$ to $NK_3$ here correspond to an increasing intensity of adjacent channel interferences.)

The switching between the individual filter states takes place without any interfering influences (e.g. clicking noises). Also, no annoying transitory phases develop here because a switch to the next, more selective filter state is made already before an interference limit level is reached.

In addition to adjacent channel and field intensity detection, which control the transmission characteristic of the filters, a two-stage reflection detection is provided which influences the low frequency.

Reflection Detection

As for adjacent channel interferences, reflection interferences are also detected by the amplitude modulation of the IF they produce. The superposition of several modes in different phase positions produces amplitude contractions in the IF whose envelope curve has a broadband LF spectrum. Since the desired modulation also leads to a slight amplitude modulation at the IF, a frequency range which is contained only to a slight percentage in the MPX signal is filtered out of the spectrum of the IF envelope for detection of reflection. This frequency range lies between 20 and 30 kHz. The output voltage of the filter stage employed for this purpose (attenuated LC resonant circuit) is fed to a threshold switch which puts out an unequivocal detection signal. Reflection interferences are detected in two intensity stages; in stage 1, a switch is merely made from stereo operation to mono operation; in stage 2, the LF is muted.

Reflection Detection and Muting Circuit

Reflections as well as noise lead to amplitude contractions in the IF signal. If there are reflections, these contractions are produced by the superposition of reflected modes on the directly received mode; if there is noise, noise components are superposed on the received signal. The average value of the IF signal decreases with increasing noise until it becomes no-load noise. It is thus always in the noise range. If there are reflections, however, the average may have high values. The statement about the amplitude contractions of the IF is now linked as follows with a statement about the magnitude of the average of the IF:

If the average of the IF is low, the reason for the contractions of the IF may either be noise or the reception of reflections. The possible causes lead to the impression of interference for which the same switching measure is required: reduction of volume (muting) of the LF signal.

If the average of the IF is high, the reason for the amplitude contractions can only be the reception of reflections. Since the beginning of the interference in stereo reception lies before mono reception, a switch is initially made from stereo reception to mono reception and if the contractions become greater and the mono signal is also interfered with, the LF volume is also reduced.

Detection of Adjacent Channel Takeover

In this case, there are short-time breakthroughs of the adjacent channel which lead to "plop" like noises. By way of a threshold switch to which is fed the lowpass filtered low frequency, unequivocal detection will result.

The particular advantages of the arrangement according to the invention are the following:

Without influencing standard receiver values (LF distortion factor, stereo crosstalk) all interferences with reception that originate from the natural limits of conventional receivers with respect to reception sensitivity and selection quality are eliminated or reduced:

stations that are barely discernible in the noise are received clearly (increase of sensitivity 8 to 10 dB);

interferences due to short-term signal weakening (shading, flutter fading, etc.) are reduced considerably;

adjacent channel interferences up to the highest intensity, namely the complete takeover of the adjacent channel, are suppressed (selectivity gain about 30 dB);

not only adjacent channel interferences but also other in-band interferences, such as, for example, intermodulation interference or interference by the Eurosignal, are suppressed;

stereo reception is possible even if mono reception in conventional receivers is already interfered with;

due to the high interference immunity, the stereo threshold could be shifted by about 6 dB toward lower receiving field intensities compared to conventional receivers;

increased transmission reliability results for additional signals such as, for example, in a radio data system;

interferences from far-away reflections are reduced.

BRIEF DESCRIPTION OF THE DRAWINGS

The invention will be described below in greater detail together with a description of the preferred embodiment of the invention and reference to the drawing figures wherein:

FIG. 2 is a truth table as the basis for the logic linkage of the signals characteristic of the receiving conditions for obtaining control signals for influencing the receiver characteristic;

FIG. 4 shows a truth table as a basis for the logic linkage to influence the follow-up characteristic of the trackable filters;

FIGS. 7a to 7f, show signal curves for the circuit of FIG. 7;

FIGS. 8a to 8c shows signal curves for the circuit of FIG. 8;

FIGS. 9a and 9b show signal curves for the circuit of FIG. 9;

FIG. 10 is a circuit diagram for a reflection detection circuit;

DETAILED DESCRIPTION OF THE PREFERRED EMBODIMENT

Figure 1A:
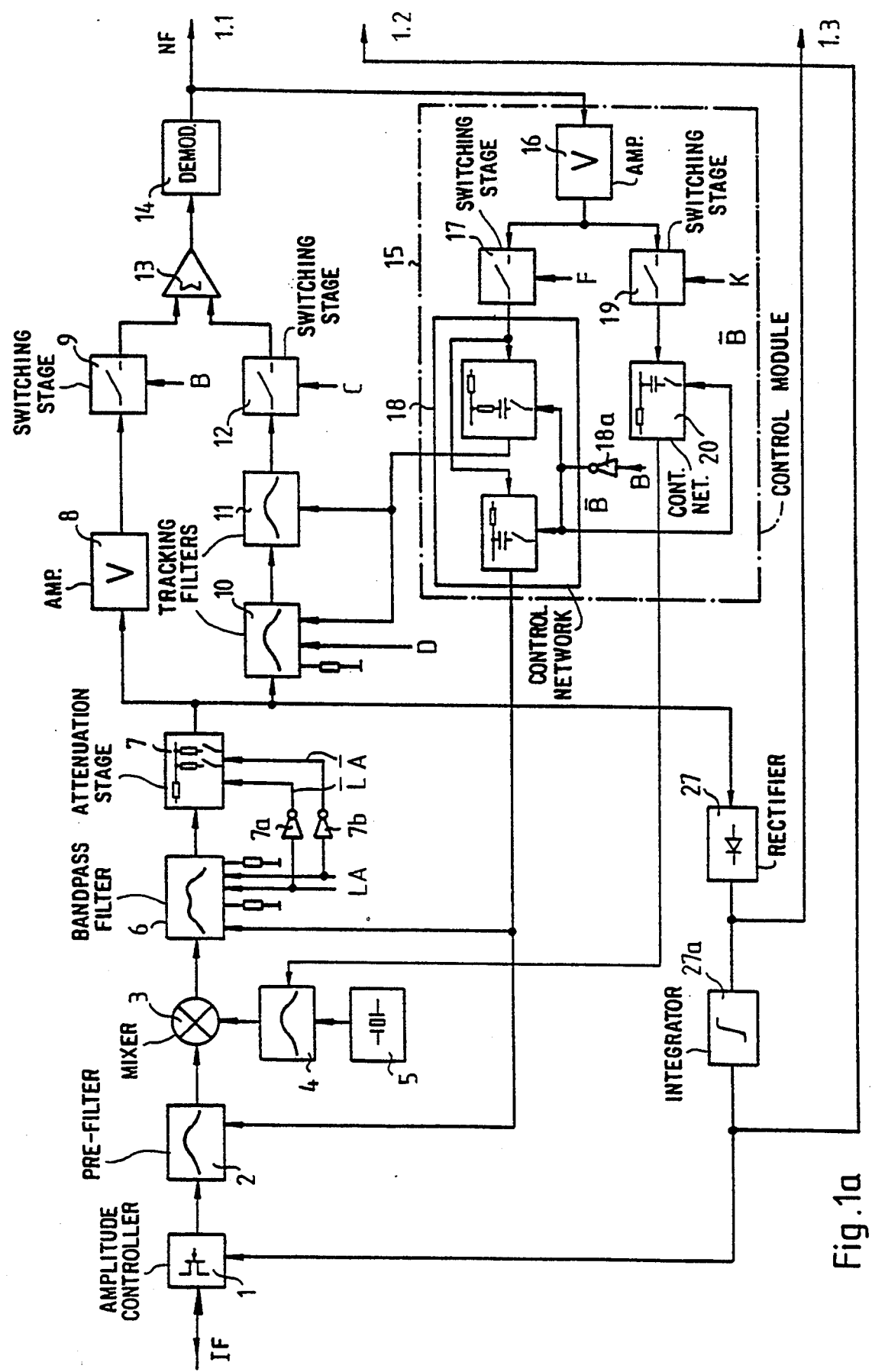
FIGS. 1a and 1b, are a block circuit diagram of one embodiment of the FM receiver according to the invention.

The basic configuration of the circuit will be discussed first. The FM stereo receiver shown in FIGS. 1 and 1b is illustrated in the form of a block circuit diagram without preliminary and mixer stages so that a standard IF signal at a frequency of 10.7 MHz is present as the input signal at the input of the illustrated block circuit. The so-called MPX signal ("MPX"=multiplex) is a conventional analog FM stereo radio signal.

The 10.7 MHz IF input signal travels from an input (arrow) through an amplitude control stage 1 including an FET as the controllable, variable resistor, to a single circuit IF prefilter 2 having a bandwidth in the range of 150 kHz.

Filter 2 is followed by a mixer stage 3. At the output of the mixer stage, the IF signal is available in the 700 kHz range. The frequency of an oscillator 5, which influences the mixer stage by way of a phase modulator 4, is thus 10 MHz.

The output signal of mixer stage 3 reaches a two-section bandpass filter 6. By connecting internal resistances in parallel, this bandpass filter can be attenuated in two stages by means of two control signals L and A present at the respective inputs. The resistances are indicated symbolically in the drawing and are connected in parallel with the filter circuits so as to obtain increased filter attenuation in a known manner. In this way, the transmission curve is flattened as desired. The bandwidth of the bandpass filter of about 90 kHz is suitably dimensioned for transmission of the multiplex signal.

The output of the bandpass filter is followed by an attenuation stage 7 serving as a level reducing circuit; it can be used to directly select two different level reductions by means of control signals $\overline{L}$ and $\overline{A}$. These signals are derived from signals L and A by means of inverters 7a and 7b.

The level reductions that can be switched in compensate for the level change produced by the selective attenuation of the bandpass filter so that the IF signal at the output of stage 7 has a substantially constant amplitude. Deviations are compensated by a control to be described in greater detail below whose input signal is obtained following the output of stage 7—possibly after linear amplification.

Following the output of attenuation stage 7, the further signal processing is divided. In the processing branch shown at the top of the drawing figure, the amplitude is amplified slightly without influencing the frequency response.

The output of amplifier 8 is connected to a controllable switching stage 9 with which the respective signal processing branch can be switched off in response to a corresponding control signal B. A signal is obtained at the output of the amplifier which is fed to various stages to be described below. This signal is not affected by switching stage 9.

In the next signal branch shown in the drawing figure, the signal reaches the input of a first of two very narrowbanded, series-connected pull or tracking filters 10 and 11. "Very narrowbanded" here means approximately 20 kHz. The first one of these filters can also be attenuated in response to an appropriate control signal D by the parallel connection of an appropriately dimensioned resistor. The attenuation is shown symbolically in the drawing by a resistor.

The (individually switchable) attenuations produce a flatter shape of the respective transmission curve in bandpass filter 6 as well as in single filter 10.

The second single filter 11 is followed at its output by a further switching stage 12 with which the respective signal processing branch can be turned off, in response to a control signal C.

The output signals of switching stages 9 and 12 are summed in an adder stage 13. Adder stage 13 is a summing amplifier which steps the filtered IF signal up to the level required for the subsequent demodulation in demodulator 14.

The follow-up voltage for the preceding filter stages is derived from the demodulated signal which, for this purpose, is initially fed to a control module 15 (outlined in dashed lines). The output signal of an input amplifier 16 travels in parallel through two switching stages 17 and 19 activated by control signals F and K, respectively. Following the switching stage 17 is a control network 18 whose filter characteristic can be switched. From it, the follow-up voltages or control signals are derived for prefilter 2 and bandpass filter 6, on the one hand, and for the two single filters 10 and 11, on the other hand. Following the switching stage 19 is a control network 20. The control signal for the phase modulator 4 is obtained by way of the control network 20.

The demodulated signal marked "NF" at the output of demodulator 14 is slightly raised in level by means of an amplifier stage 21 and is fed to a first correction filter 22, as shown in FIG. 1b. This correction filter is followed by a second correction filter 23 which can be selectively bridged by means of a switching stage 24 that is controllable by means of an external signal J. By means of correction filters 22 and 23, the output signal is subjected to a level and phase correction so as to equalize the different level and phase curves in the two preceding filter branches in accordance with the respectively selected type of processing.

In the case of the occurrence of adjacent channel interferences, which will be described later, switchable filter 23 slightly raises the level of the LF signal so as to compensate for the reduction in level caused by the then narrower IF bandwidth.

The thus corrected IF signal, which includes all components of the MPX signal, is fed to a controllable muting circuit 25 connected to follow the correction stage and is then fed to a stereo decoder 26, at whose output appear the left and right LF signals $NF_L$ and $NF_R$, respectively. By means of an appropriate control input E, the stereo decoder can be set for mono operation. In that case, both LF output signals are identical.

The intermediate frequency is regulated to a fixed voltage value. For this purpose, it is fed to a control circuit composed of a rectifier 27 (see FIG. 1a) and an integrator 27a at whose input appears the control deviation and whose output signal constitutes the control voltage.

The rectified IF, as the input signal of the control circuit, whose average remains constant within the control range, serves as the input value for adjacent channel detection, reflection detection and muting detection.

The control voltage at the output of the integrator is a measure, within the control range, for the input level of the IF and thus a measure for the level of the desired field intensity. The control voltage is fed to a further detection circuit from which merely a statement is obtained as to whether the input signal lies above or below a certain level (e.g. 2 $\mu V$ antenna input voltage).

The low frequency signal is the input value for a further detection circuit from which information is derived as to whether an adjacent station temporarily "breaks through." In this interference range of adjacent channel takeover, the detection circuit emits an appropriate signal.

The input variables of the detection circuits combined in detector module 28 (see FIG. 1b) are thus the following:

1. the rectified IF on line 1.3 for adjacent channel and reflection detection as well as for muting;
2. the control voltage of the IF on line 1.2 for detection of the magnitude of the field intensity; and
3. the low frequency signal on line 1.1 for adjacent channel takeover detection.

These detection circuits are combined in detector module 28, which is outlined in dashed lines and whose output signals are fed as control signals to the various filter and switching stages. They generate all necessary switching signals which switch the filter and follow-up characteristics as well as further signal processing criteria to ensure, in spite of interfered-with reception conditions, the relatively best listening quality. Not included in module 28 are the above-described circuits for generating follow-up voltages.

Thus, the input signals for almost all detection circuits included in module 28 can be derived from the envelope curve as the output signal of circuits 27, 27a; this includes the field intensity detection circuit 29 for detecting a weak signal, the adjacent channel detection circuit 30, the reflection detection circuit 31, the adjacent channel takeover detection circuit 32 and the field intensity detection circuit for muting 33. The latter circuit serves to actuate the muting circuit 25 and emits an output signal if the playback volume is to be reduced due to sudden noise. It detects the point at which the desired signal is drowned in the noise, and thus when the IF becomes too low to furnish a usable LF signal. This circuit corresponds to the prior art muting circuits as they are employed, for example, during tuning to suppress noise when sharp tuning individual stations.

In a variation shown in FIG. 1b by way of a dashed-line connection following reflection detection circuit 31, the mute signal is determined, instead of by a separate circuit 33, also by circuit 31 (output a). Additionally, this circuit also generates a signal to switch the antenna if antenna diversity is provided for (output d2). The details for this will be described in connection with FIG. 10.

The adjacent channel detection circuit 30 is followed by three discriminator circuits 34 to 36 which differentiate between individual stages of different adjacent channel interference intensity, with circuit 34 being associated with the weakest interference intensity and channel 36 with the strongest interference intensity.

The output signals of these detection circuits reach a subsequent evaluation circuit 37 which controls the signal processing by way of logic linkages and as a function of the output signals of the preceding circuits. In dependence on the detected receiving conditions, filter attenuations, signal processing paths and thus the transmission characteristics are switched. The total filter characteristic is controlled in that the attenuation is added or taken away and selectively only one processing channel is now switched through or both are superposed or only the other processing channel is switched through depending on the result of the logic linkage.

This is initially done independently of the actual follow-up control since the resonance position of the filters is constantly influenced by way of the respective control module 15. However, signals are obtained additionally at the output of the evaluation circuit 37 so as to influence the follow-up characteristic in order to adapt it optimally to the receiving conditions.

Figure 3:
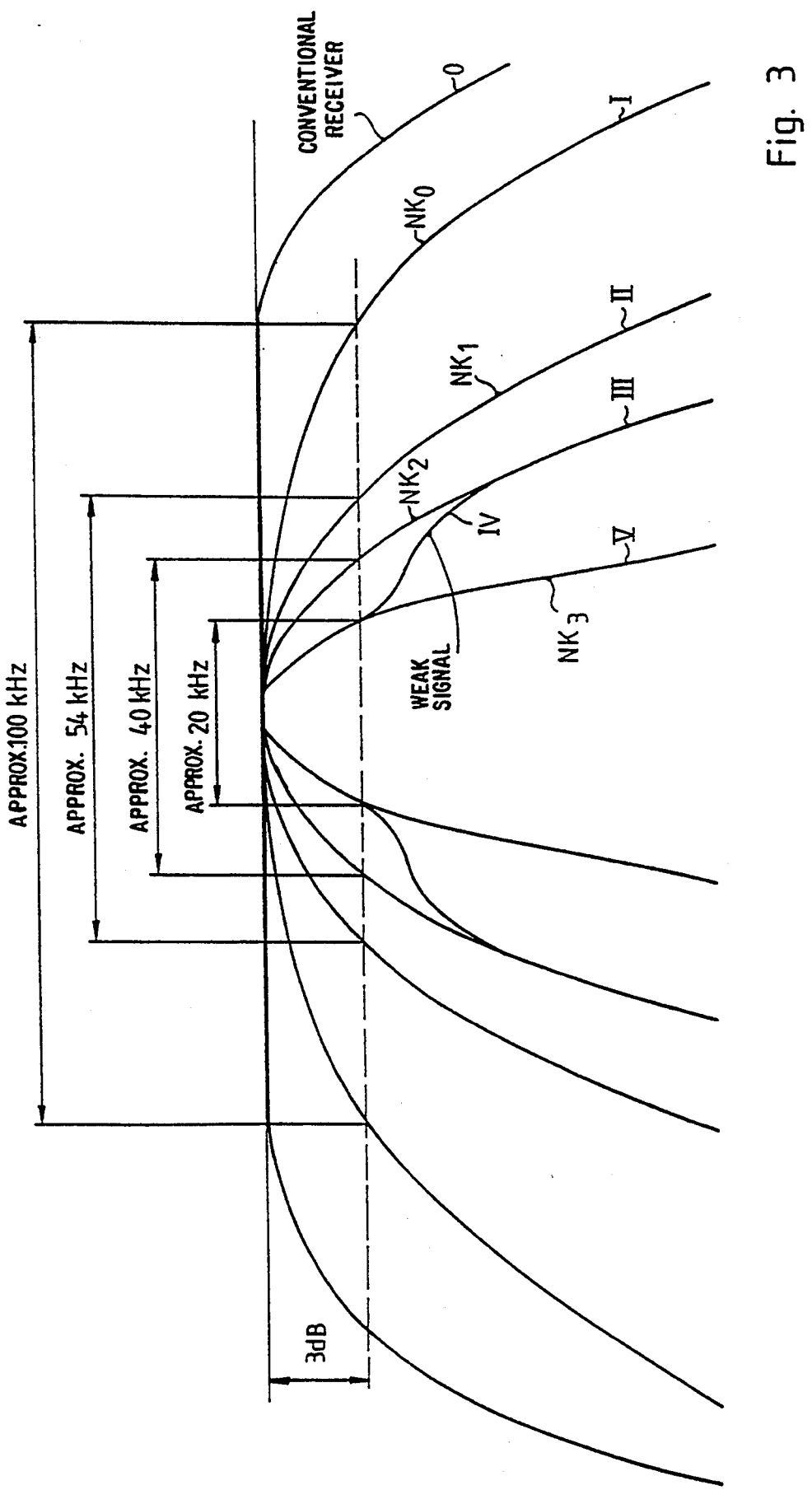
FIG. 3 shows various IF transmission curves effective under different receiving conditions.

The various logic linkages of the input signals according to evaluation circuit 37 result from the truth table of FIG. 2 which represents a logic unit 200. The transmission curves resulting for the various control possibilities are shown in FIG. 3. The signal detection component represented by the circuits according to detection circuits 29 to 33. The signal processing unit includes the amplitude discriminators (threshold stages) of the above-mentioned circuits and at least the timers or time constant modules 701 of the circuit of FIG. 6 which will be described in greater detail below. The linkage circuit establishing the association between the variables which are decisive for the receiving states and the variables for the control inputs of the stages of the signal processing unit is formed by logic units 200 and 400 according to FIGS. 2 and 4.

After detection of the respective receiving situation, the transmission behavior is switched correspondingly.

For input field intensities above approximately the sensitivity limit range of conventional receivers and with a relatively small ratio of adjacent channel station to desired station, the system is switched to the "$NK_0$" state. Here only the linearly amplified portion (stages 8 and 9) of the output signal of the attenuated bandpass filter 7 (switching signals L and A cause bandpass filter 7 to be attenuated) is switched to the demodulator. Switching signal B closes switch 9. With respect to attenuation, the first stage is active (switching signals L and A are inverted and conveyed to level reducing stage 7). The behavior of single filters 10 and 11 is without significance.

The total filter bandwidth for $NK_0$ is about 130 kHz.

Due to the use of tracking filters, the broadest transmission curve (I in FIG. 3) in the receiver according to the invention is still rather narrow compared to the transmission curves of receivers equipped with conventional filters (marked "0" in FIG. 3), but it is relatively wide compared to the bandwidths to be switched in if there is intensive adjacent channel interference, as will be described in detail below.

This type of operation results in a considerable increase in selectivity compared to receivers having fixed filters.

If the ratio of adjacent channel intensity to desired field intensity increases, a switch is made to "$NK_1$". This state results in curve II of FIG. 3. The corresponding control signal which actuates these functions is furnished by discriminator circuit 34.

At $NK_1$, bandpass filter 6 is less attenuated (switching signal A). As can be seen in FIG. 3, the bandwidth of the transmission curve is about 54 kHz.

With increasing adjacent channel interference, stage $NK_2$ becomes active, with the respective switching state being initiated by the output signal of discriminator circuit 35 of FIG. 1b. As can be seen from the table of FIG. 2, and the first (bandpass) filter 6 thus remains unattenuated, the second channel, attenuated by the control signal, is switched on.

Thus, the signal channels are still active. The transmission curve marked III in FIG. 3 results. The width of the IF is still 40 kHz. While full stereo is present at $NK_0$ and $NK_1$, the stereo base width is reduced considerably at $NK_2$.

The next switching stage IV is reached if the received field intensity falls below a minimum level which lies at about 2 µm as indicated by the respective output signal of field intensity detection circuit 29.

This leads to the following state: bandpass filter 6 is de-attenuated (switching signals L and A off), both channels are active (switches 9 and 12 on by way of switching signals B and C), and single filter 10 is de-attenuated (attenuation signal D off). The resulting transmission curve corresponds to curve IV of FIG. 3. It is evident that in the resonance range this curve has the customary LC resonant circuit characteristic and, after a drop of about 8 dB, changes to the bandpass filter curve $NK_{2(III)}$. The "shoulders" in the transmission range lead to improved follow-up capability so that, even with very weak received signals which, with a conventional receiver, are hardly discernible in the noise, good reception is possible.

A receiving state which even further increases selectivity becomes effective at extremely strong adjacent channel interferences. It is marked $NK_3$, as indicated by the corresponding output signal of discriminator circuit 36 in FIG. 1.

A received signal affected by class 3 adjacent channel interference ($NK_3$) exhibits extremely strong adjacent channel interferences extending to the complete takeover of the adjacent station. In the system according to the invention, the transmission curve of the filter arrangement is con tracted even further (curve V in FIG. 3) and becomes so narrowbanded in its signal processing that even the strongly active adjacent channel interference is cut out. For this purpose, the narrowbanded channel only is operated without attenuation (switching signals B and D off, switching signal C on). The 3 dB bandwidth is about 18 kHz.

Thus, only the narrowest bandwidth at all is available: the operating state is mono. Filter and oscillator control voltages optimized for this state of highest selectivity result in a transmission whose quality will hardly be influenceable.

A filter transmission characteristic realized in this manner can also be realized in some other way without departing from the idea of the invention, for example by means of digital filters.

A further variable in the received signal that is influenced by quality criteria is listed under VI in the table of FIG. 2 as the detection of reflections. While for the above discussed reception quality criteria the signal to be described later always constituted a worsening which had "priority" over the previously described ones, i.e. precedes them in processing and "overruns" the lower ranking signals (see the description of FIG. 6 below), the detection of reflections becomes effective under all receiving conditions. When reflections are detected by means of circuit 31, switching signal E switches the stereo decoder back into mono operation. According to the variation shown in dashed lines in FIG. 1b, in which the signal for switching back to mono operation is detected by means of the reflection detection circuit together with the mute signal in that characteristic contractions develop in the IF, switching back due to the detection of reflections (IV) occurs, if there is no simultaneously detected "weak signal" identification signal (IV), that is, if the contractions indicate reflections but not noise.

While FIG. 2 represents a truth table for the deformation of the transmission curve as a function of variables characteristic of receiving conditions, FIG. 4 gives an overview in the form of a truth table for the follow-up characteristic of trackable filters in logic unit 400. Variables I to V, which are characteristic of the received signal, correspond to the illustration of FIG. 2. While the detected reflections have no influence on the follow-up characteristic, an additional signal VII is listed which, if adjacent channel takeover is detected, likewise causes the follow-up filters to be switched.

Figure 5A:
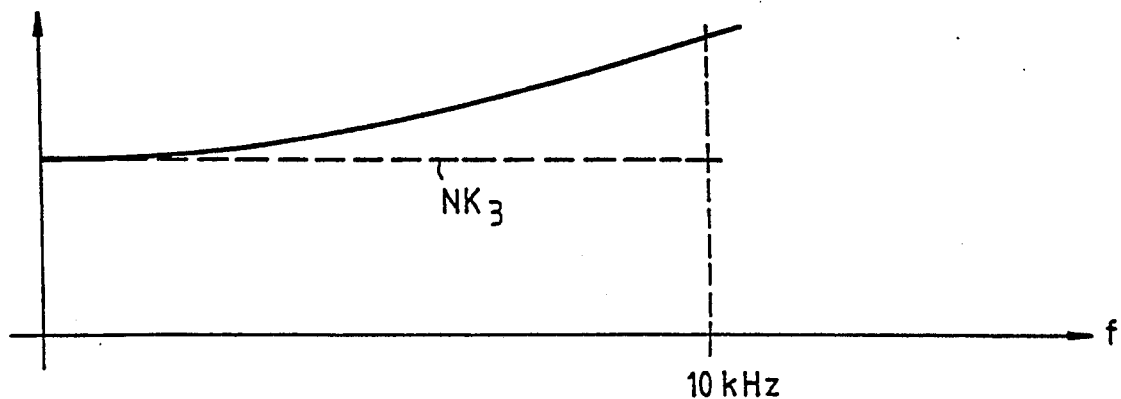
FIG. 5a shows the variable follow-up characteristic of the single circuit filters.
Figure 5B:
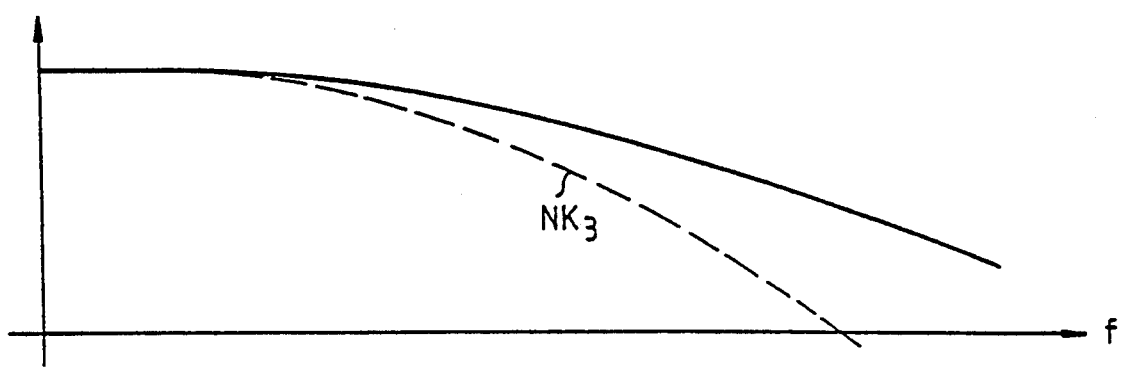
FIG. 5b shows the variable follow-up characteristic of prefilters and bandpass filters.

The signal $\bar{B}$ which evolves from signal B by inversion generates a frequency response switch in the follow-up characteristic of the single filters 10 and 11 the prefilter 2, and the bandpass filter 6 as well as for the phase modulator 4 in receiving state $NK_3$. While the follow-up of single filters 10 and 11 (FIG. 1) from the right-hand portion of block 18 extends in normal operation with a slight rise up to a frequency limit of 10 kHz (see FIG. 5a—solid curve), switching of signal $\bar{B}$ causes a lowpass filter to be switched in so that the frequency response is almost planar (dashed line in FIG. 5a). In receiving states $NK_0$ to $NK_2$, the frequency response for the control voltage of the prefilter 2 and of the bandpass filter 6 has a slightly lowpass characteristic. Due to the switching produced by signal $\bar{B}$, the lowpass characteristic is enlarged (see FIG. 5b—dashed line).

Additionally to be considered in FIG. 4 is the signal state VII of adjacent channel takeover, which constitutes an extreme state of interference in that the radiation produced by the adjacent channel station is so high that for a short time its modulation is taken over. Because this would cause the filter follow-up to jump over to the adjacent channel station, which in this case would only increase the impression of interference, the filter follow-up in the case of adjacent channel takeover is switched off by signal F. This measure constitutes a rounding-off measure in the system according to the invention which, as a whole, contributes to an improvement in the impression the system gives the user to whom the LF signals are offered. Filter follow-up is switched off by switching stage 17 of FIG. 1.

Figure 6:
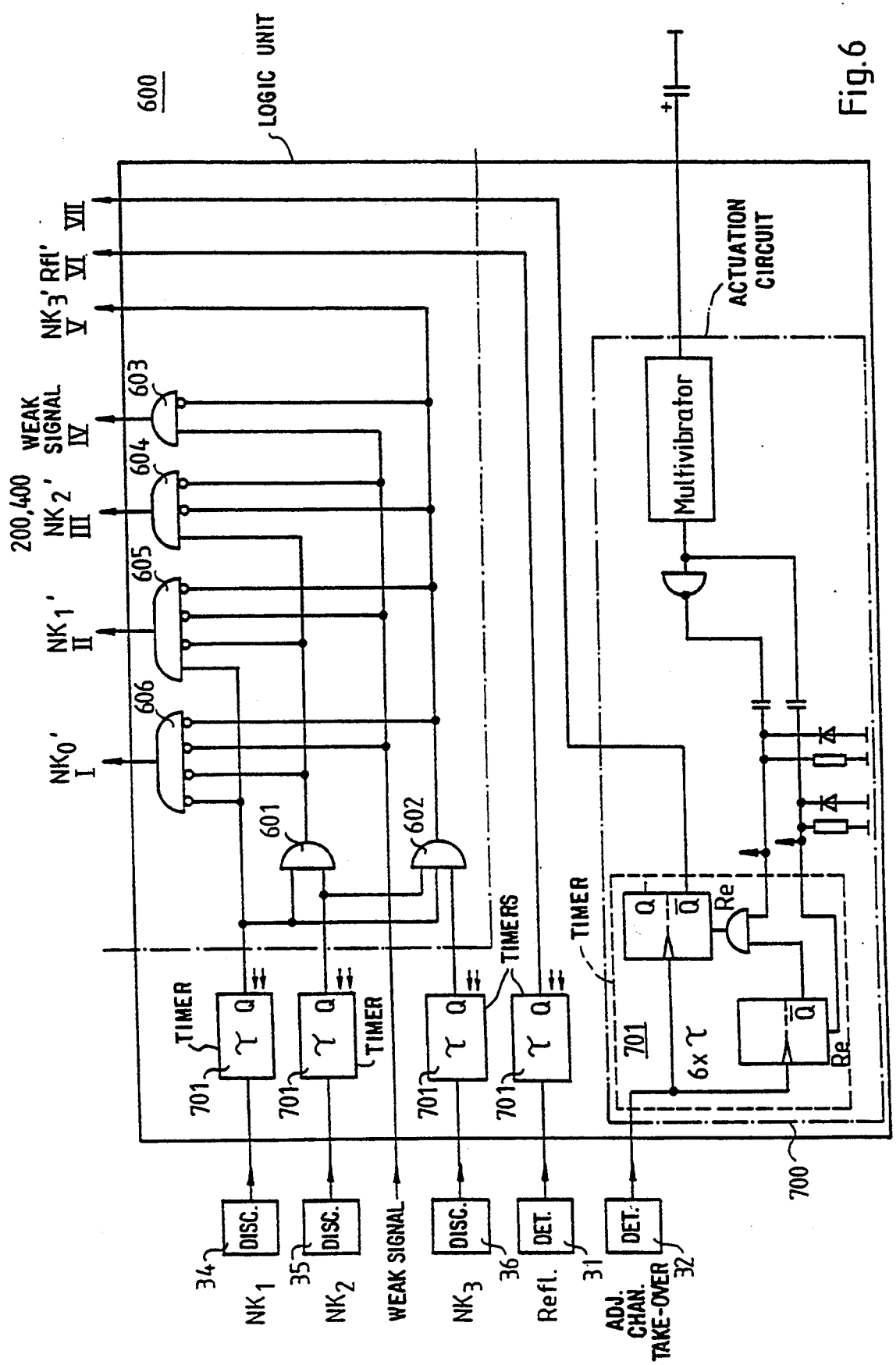
FIG. 6 is a block circuit diagram of part of the control logic.

The evaluation unit 37 of FIG. 1b formed according to the truth tables of FIGS. 2 and 4 also includes a circuit as shown in FIG. 6 which contributes to an improvement in the low frequency signal. While the truth tables according to FIGS. 2 and 4 can be realized to correspond to the selected embodiment by linking logic gates or by appropriate software control according to known circuit and software technology rules, FIG. 6 shows an embodiment with a hardware solution.

The signal processing circuit according to FIG. 6 precedes the evaluation logic according to FIGS. 2 and 4 so that the output signals of components 31, 32 and 34 to 36 according to FIG. 1b initially reach the circuit according to FIG. 6, while the logic unit 600 shown in FIG. 6 itself is able to actuate logic units 200 and 400 as shown schematically in FIGS. 2 and 4. The signal processing circuit according to FIG. 6 includes time threshold circuits which, together with the thresholds of circuits 29 to 33, take care of reliable control signal discrimination while avoiding unstable and undefined switching states.

Since after a response of the adjacent channel detection circuit, signal processing becomes more narrow-banded, the ratio of adjacent channel station to desired station, i.e. the detection information, decreases. This decrease in detection information is compensated by a corresponding increase in the response threshold. The decrease in the detection information also has an effect on the response thresholds of the individual stages: if the filter characteristic were to remain constant, the detection information would not decrease and the response thresholds of the individual stages would be staggered in position one below the other so that an unequivocal sequence in the response would inevitably be given.

Here, however, the detection information decreases once a stage has responded so that the response thresholds of the individual stages do not lie clearly one below the other but all have approximately the same value. To nevertheless realize an unequivocal response sequence, the invention provides for blocking of a detection stage by the preceding stage. This blocked stage is released only after the preceding stage has responded. Thus, an AND gate takes care that among the various detection channels, a later stage responds only after a stage belonging to a lesser interference has already responded. The AND gate 601 associated with stage $NK_2$ receives the output signal of stage $NK_1$ so that the latter must have responded before $NK_2$ responds that—is, if filter conditions exist for which the response threshold of $NK_2$ is dimensioned. Corresponding conditions apply for AND gate 602 and the output signals of stages $NK_1$ and $NK_2$ in connection with the response of stage $NK_3$.

Further AND gates 603 to 606 ensure the priorities of the signals in the sequence $NK_3$, weak signal, $NK_2$, $NK_1$ and $NK_0$ with respect to forwarding for further processing.

In order to prevent the output signals of logic unit 600 from frequently changing the receiving characteristic of the system as a result of short-term, pulse-like breaks in the signal or interferences with the signal, a detection pulse at the output of a comparator sets a retriggerable timer circuit, e.g. a monostable multivibrator, whose output voltage constitutes the switching voltage. Only if no comparator output pulse is present for the time period of the holding time, will the switching voltage decrease. This measure combines numerous successive individual pulses at the output of the comparator into one continuous switching voltage.

In order to avoid, particularly if the circuit is realized in integrated form by means of analog circuitry, the use of an unnecessarily large number of counters or other timers which increase the chip surface of an integrated module, an actuation circuit 700 is provided which serves to actuate time constant modules 701. Circuit 700 including a module 701 is shown in FIG. 7 and the associated pulse diagrams are shown in detail in FIGS. 7a to 7f.

Figure 7:
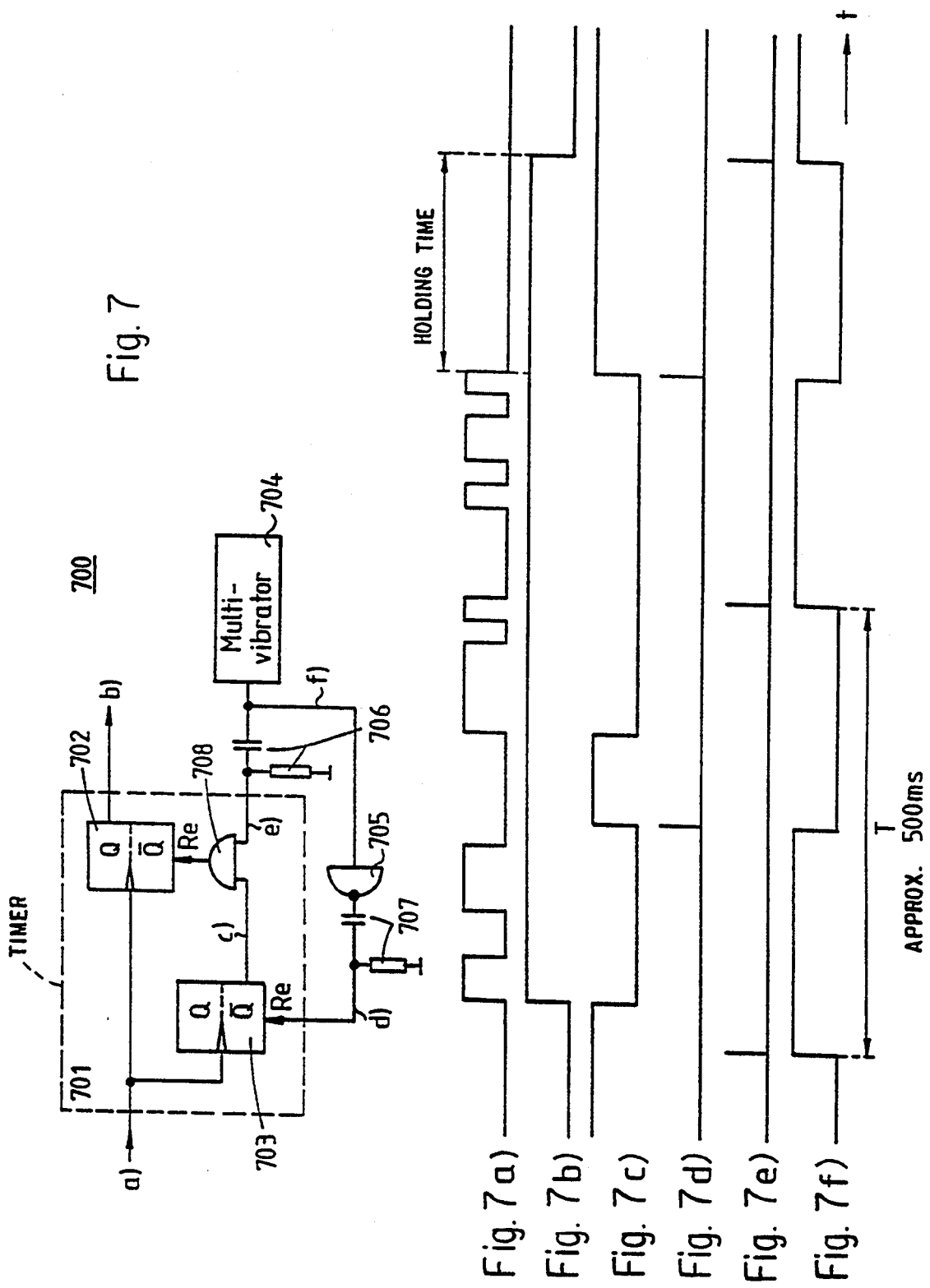
FIG. 7 shows a detail of the circuit of FIG. 6.

The time constant module 701 of actuation circuit 700 of FIG. 7 includes two flip-flops 702 and 703 which are clocked by the input signal. The input signal a)is illustrated as an example in FIG. 7a. A multivibrator 704 generates pulses at a repetition rate of about 500 msec, as indicated in the curve drawn in FIG. 7f. The output signals of the multivibrator are inverted by means of an inverter 705 and the original as well as the inverted signal are converted by means of differentiating units each formed of an RC combination into needle pulses which each correspond in time to the ascending (curve drawn as FIG. 7e) and the descending (curve drawn as FIG. 7d) edges of the signal of FIG. 7f. The pulses derived by differentiation of the noninverted signal as shown by signal curve e) reach an AND gate 708, to whose other input the inverting output $\overline{Q}$ of flip-flop 703 is connected. The output signal of AND gate 708 reaches the reset input of flip-flop 702. The differentiated inverted signal d), however, reaches the reset input of flip-flop 703. The output signals $\overline{Q}$ of flip-flop 703 enable, via AND gate 708, the reset pulses for flip-flop 702 only if no input pulses are present within the input signal of FIG. 7a for a time period of T/2. Thus, a minimum holding time is always ensured which lies between T/2 and T. In this way, it is ensured that resetting takes place only if the ratio of interfering to desired station has definitely taken on a lower value and consequently the transmission characteristic can be switched to a less selective state.

Figure 1B:
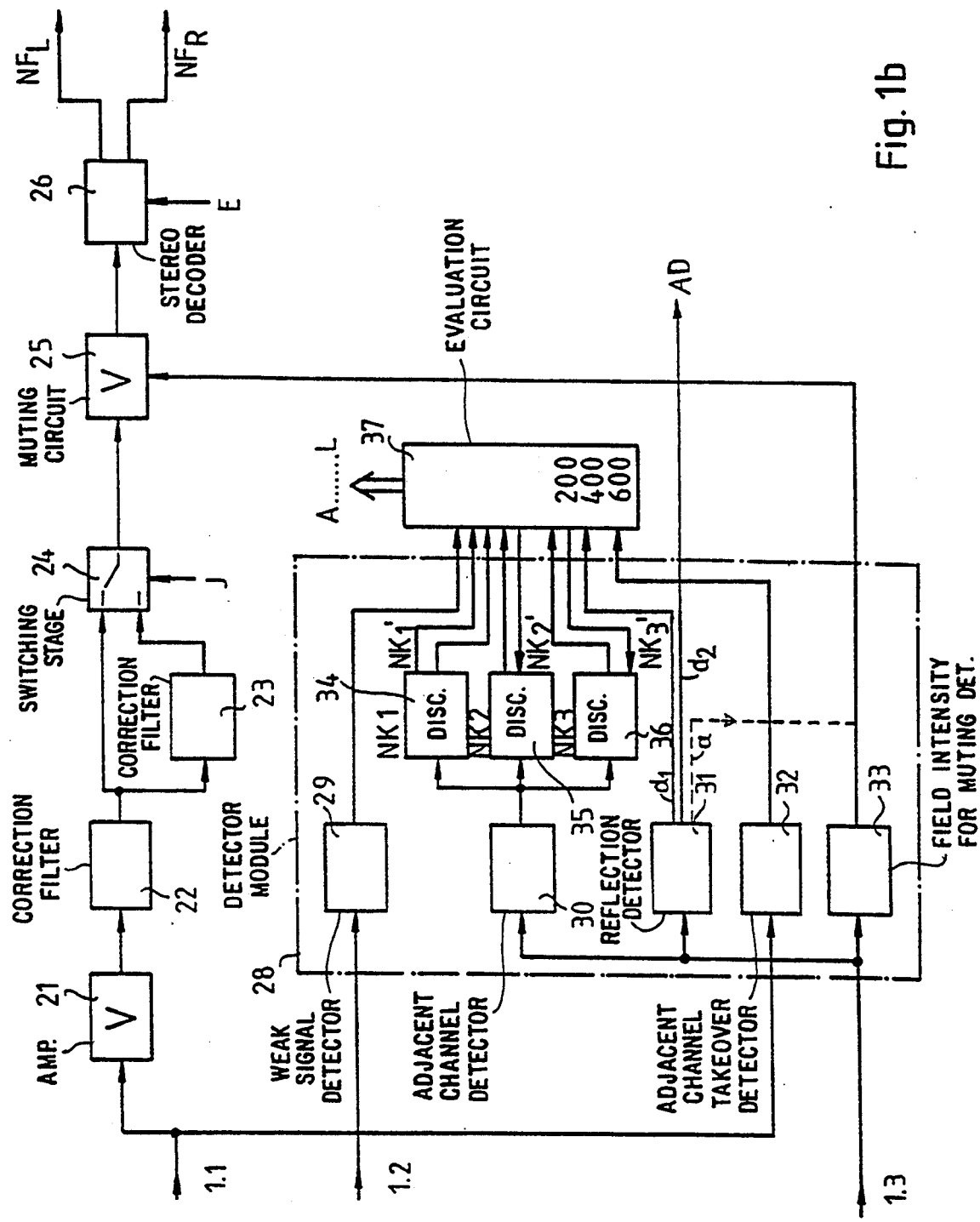
Figure 8:
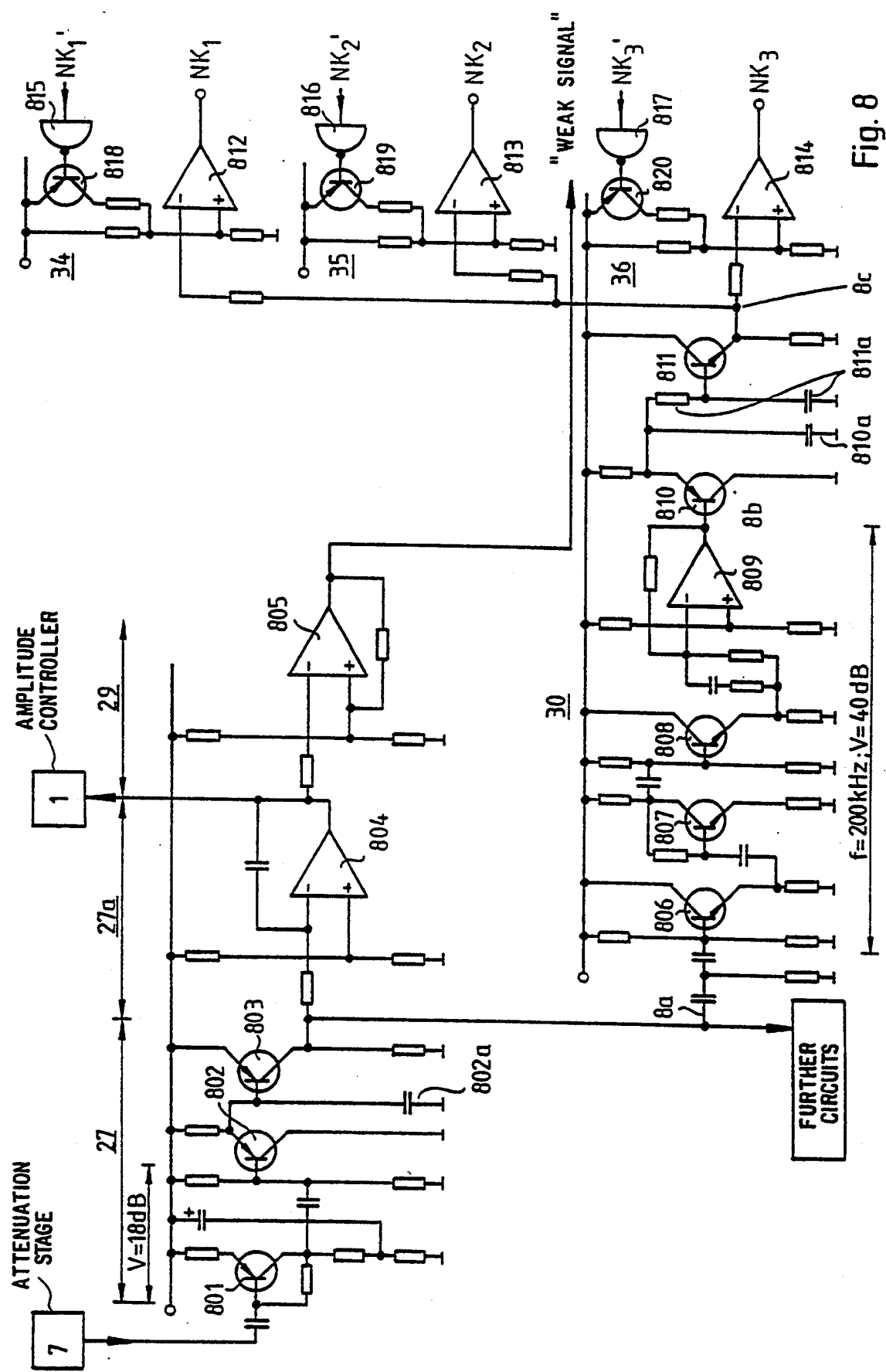
FIG. 8 is a circuit diagram for a portion of the circuit of FIG. 1 including an adjacent channel detection circuit.

The detailed circuit diagram shown in FIG. 8 for some of the components shown in FIGS. 1a and 1b, includes rectifier circuit 27, integrator 27a, detection circuit 29 for a "weak signal" detection circuits 34 to 36 for adjacent channel interferences $NK_1$ to $NK_3$. These modules will now be described by identifying only their active components since the arrangement of the passive components is self-evident from the described configuration and function of the individual stages, with it being stipulated that the configuration and function of the individual stages is known.

The first stage including a transistor 801 constitutes a conventional amplifier stage. The subsequent transistor 802, together with a capacitor 802a, forms an envelope rectifier which is followed by an emitter follower 803, with the two transistors 802 and 803 being complementary types. The subsequent stage 27a including an operational amplifier 804 constitutes an integrator circuit which provides at its output the amplitude control voltage for control stage 1.

The next stage 29 includes an operational amplifier 805 and serves as comparator, with the output signal of operational amplifier 805 being characteristic of the "weak signal" receiving state. This signal is emitted if the input signal falls below a predetermined level formed at the noninverting input of operational amplifier 805. Another important characteristic of this circuit including operational amplifier 805 is a hysteresis which takes care of sufficient switching reliability.

The adjacent channel detection circuit 30 receives its output signal from the output of stage 27 (transistor 803). This signal is shown in FIG. 8a. An input transistor 806 includes an associated highpass filter. In the subsequent stages composed of transistors 807, 808, and an operational amplifier 809, the signal is amplified by 40 dB. The output of the operational amplifier is connected to a further transistor 810 and a capacitor C 810a serving as an envelope curve demodulator. It is followed by an emitter follower 811 preceded by a lowpass filter 811a—composed of an RC combination. The emitter of transistor 811 is connected to the inputs of stages 34 to 36 which form comparator circuits and include operational amplifiers 812 to 814. The noninverting inputs of these operational amplifiers 812 to 814 receive different direct voltage levels which constitute the reference values for a discrimination between adjacent channel interferences in stages 34 to 35.

The outputs of operational amplifiers 812 to 814 furnish signals $NK_1$ to $NK_3$ which are characteristic of adjacent channel interferences. Each discriminator circuit 34 to 36 has a hysteresis circuit which is associated with a transistor 818 to 820—actuated by way of an inverter 815 to 817, respectively—and which reduces the respective threshold voltage by switching off a parallel resistor whenever the associated logically processed adjacent channel interference signal $NK_1'$, $NK_2'$, and $NK_3'$, respectively, appears. In this way, uncontrolled signal transitions are avoided. The inverters take care that their associated switching transistor is blocked, i.e. no input signal appears at the base of the transistor which would switch the transistor to be conductive if the respective adjacent channel interference state is indicated by the corresponding output signal at the associated operational amplifier 812 to 814. The hysteresis circuit takes into consideration the time control described in connection with FIGS. 6 and 7 so that the signal intended for further processing, which is weighted in time and identified by a "'" is employed as a reference signal for the hysteresis circuit.

Thus, in the illustrated adjacent channel detection circuit, highpass filtering is followed by amplification, envelope curve formation, lowpass smoothing of the rectified IF signal and level detection.

For the subsequent adjacent channel detection, the interference is detected which forms between the desired channel and the adjacent channel. A subsequent highpass filter is designed for the interference occurring between the desired channel and the adjacent channel and which can be detected as amplitude modulation in the IF signal as shown in FIG. 8b.

The interference signal in the range of frequencies from about 60 kHz is filtered out, with signals other than amplitude modulation at the IF being eliminated and the interference signal remains as the characteristic of adjacent channel interference (FIG. 8c). The filter has a lower cut-off frequency of about 40 kHz and is configured as a dual polarity highpass filter. The subsequent amplification is effected by way of a normal transistor followed by the operational amplifier.

The switching of the input level effected by the described hysteresis circuits for the detection circuits formed by the operational amplifiers also takes care that the changes in level as a result of a change in the bandwidth during signal processing do not cause immediate switching back to the detected signal condition after a change in signal processing.

As soon as processing becomes more narrowbanded, both interference informations decrease simultaneously so that the respective adjacent channel detection circuit would no longer respond. Without compensatory measures this would result in undesirable oscillation of the output signal of the detection stage. The described hysteresis circuit, however, counteracts this undesirable state in that the comparison voltage is reduced once the respective signal condition has been detected so that the envelope curve amplitude remaining after a reduction in filter bandwidth still exceeds the response voltage.

Figure 9:
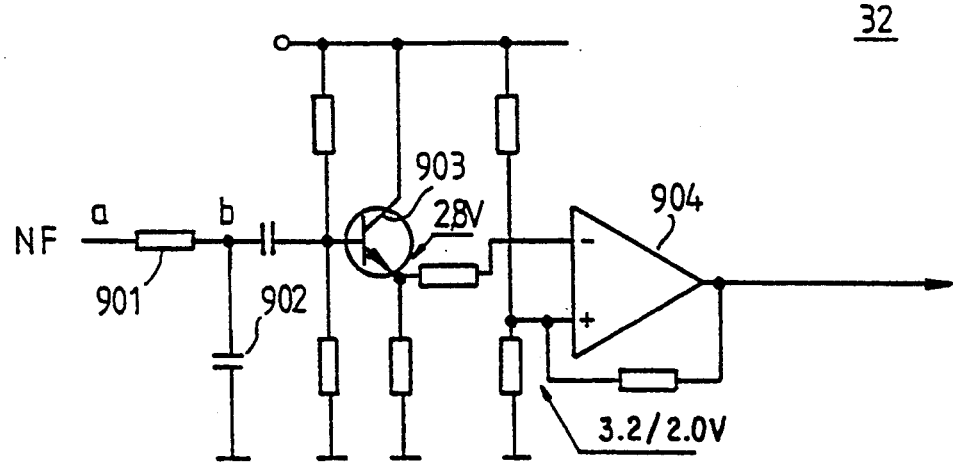
FIG. 9 is a circuit diagram for an adjacent channel takeover detection circuit.

FIG. 9 shows the adjacent channel takeover detection circuit 32.

This circuit evaluates a strong "plop" noise generated during a brief takeover of the signal of the adjacent channel station. The input signal according to FIG. 9a indicates the jump available from the lowpass filtered low frequency at the output of demodulator 14. An RC combination formed of a series resistance 901 and a subsequent, grounded capacitor 902 acts as lowpass filter so that the smoothed signal shown in FIG. 9b appears at point b. This signal is fed to a transistor 903 connected as emitter follower which serves as an impedance converter for a subsequent operational amplifier 04. The latter compares the available signal with a reference level of about 2.0 to 3.2 volts generated at its non-inverting input and including a hysteresis which serves for switching safety. If this reference level is exceeded, it generates a voltage pulse at the output of operational amplifier 904, which pulse is provided as a detection signal for the occurrence of adjacent channel takeover to be processed further—as described.

In the reflection detection circuit 31 shown in FIG. 10, the input signal initially reaches a bandpass filter 101. This circuit detects reflections by way of IF contractions in a range of the signal mixture which lies slightly above 38 kHz. This tuning has the surprising advantage that distortions caused by reflections are already detected in this signal although the 19 kHz auxiliary carrier signal still appears to be without interference. By detecting interferences in this range, such interferences can be detected which adversely affect the stereo signal although the auxiliary carrier does not yet indicate any adverse influences whatsoever. In a simplified embodiment, such frequency filtering may possibly also be omitted.

A subsequent transistor stage 102 constitutes an impedance converter. In the then following transistor stage 103, the signal is amplified by about 15 dB. The operational amplifier 105 following an emitter follower 104 serves as threshold discriminator, with its non-inverting input being connected to a reference level of about 3.5 to 4.4 volt formed by a voltage divider. The evaluated voltage overshoots at resonant circuit 101 cause the stereo decoder to be switched back to mono operation (signal d1).

A signal a forming an analog control signal for the mute circuit (according to the variation indicated by dashed lines in FIG. 1b) is branched off ahead of operational amplifier circuit 105. If the contractions evaluated by the preceding stages have a greater depth, as corresponds to noise interference, the circuit 25 of FIG. 1b initiates a reduction of the LF level. (However, the switching back to mono in the case of reflections is based on contractions of the IF signal at high signal levels (no signal identification as "weak signal"—FIG. 2).)

By means of a further operational amplifier circuit 106 which forms a second threshold discriminator and responds if the level is lower by a factor of 1:2.5, a digital signal (output d2) is generated which is available to switch the antenna in the case of antenna diversity. If thus the contractions at low signal levels which indicate "noise" in the IF signal fall below a predetermined value, reception quality has dropped to such a level that evaluation of the digital switching edge at the output of operational amplifier 106 actuates an antenna switching pulse in the hope of finding more favorable reception conditions with another antenna.

Figure 11:
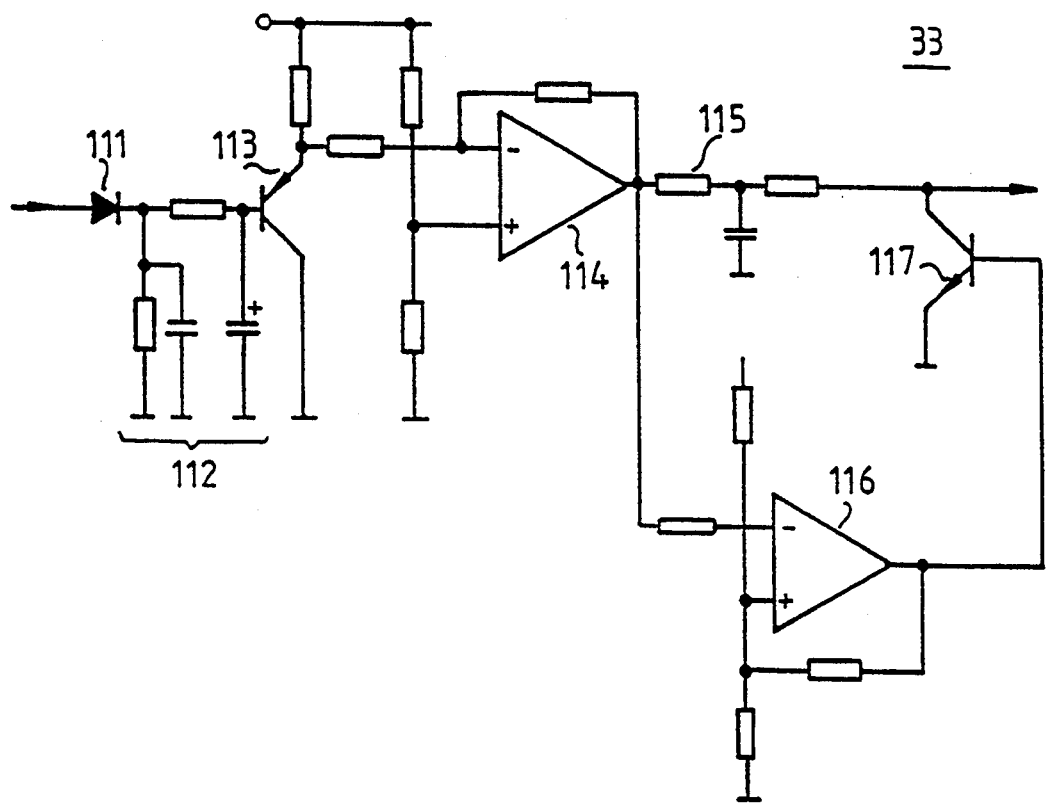
FIG. 11 is a circuit diagram for a field intensity detection circuit for the muting function.

FIG. 11 shows the field intensity detection circuit 33 for controlling muting circuit 25.

As mentioned above, the IF of 700 kHz is regulated to a fixed voltage value. The use of this regulation begins at relatively low input field intensities, for example at the point at which a station begins to be receivable. Below this level, i.e. below the onset of the regulation, the IF changes in proportion with the input field intensity until it becomes no-load noise. It is therefore ideally suited as a muting criterion. By envelope curve modulation of the IF and subsequent smoothing through a lowpass filter, a direct voltage is obtained which is fed as a control signal to the muting attenuator.

The circuit responds below the point at which regulation sets in. The regulation begins already at about 1 $\mu$V antenna input voltage. The input signal conducted through a diode 111 reaches the subsequently connected lowpass filter 112 which has a cutoff frequency of about 20 Hz.

However, the LF signal is reduced not only if the field intensities are low but also if there is reflection interference. For this purpose, a diode with subsequent RC filter are disposed at the input of the lowpass filter so as to smooth the IF envelope curve and make effective different time constants at the leading and descending edges if there are reflection contractions. This is done in that the average formed by the above-mentioned lowpass filter changes with increasing depth of the contractions in the same manner as the average changes if the signal becomes weaker.

Further signal processing is effected by means of impedance conversion in a subsequently connected emitter follower 113 and subsequent increase in level by means of an operational amplifier 114.

Another lowpass T-filter 115 connected to the output of operational amplifier 114 and having a cut-off frequency of about 4 Hz ensures that normal, longer lasting fading in the form of relatively slow signal fluctuations becomes effective only after a certain "delay time" so as to avoid too frequent and annoying switching processes.

Since the control voltage for the muting attenuator must be sufficiently smooth, a certain minimum time constant is required for the lowpass filter. This gives the muting voltage a certain inertia; it is able to follow fluctuations in field intensity up to about 4 Hz, but is too slow for faster fading breaks.

Another operational amplifier 116 connected directly to the output of operational amplifier 114 and acting as threshold discriminator detects very fast fading breaks which in this form are particularly annoying and during which the rectified IF briefly falls below a threshold. The output signal of operational amplifier 116 reaches a switching transistor 117 which, in the manner of an "OR linkage" short-circuits the output signal of the circuit shown in FIG. 11 and thus produces a signal state which is also evaluated as a "muting" instruction by the subsequent switching stage.

A further, quickly following signal which, however, is encumbered by a strong ripple is generated by the second lowpass filter which has a shorter time constant. This signal is fed to a comparator which emits a clean switching signal whenever a low field intensity level, barely above no-load noise is reached. With this signal, the muting at tenuator is suddenly switched to its highest reduction, i.e. to residual volume.

It must not be ignored that the most differing opinions exist regarding the muting behavior of equipment: from a very early onset of muting, a muting which extends to a very low level, to no muting at all, i.e. a constant volume over the entire volume range.

The combination of a slightly slow soft muting following the Gauss fluctuations in field intensity which also includes the detection of reflection interferences with fast acting fading, muting can be applied as desired in its intensity by means of external components. Of course, this circuit need not be employed, it is in any case available as a muting instrument.

Figure 12:
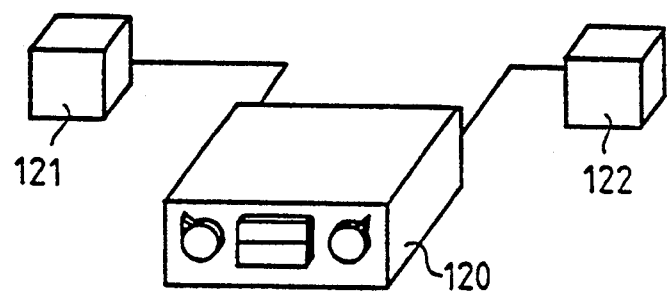
FIG. 12 shows an embodiment of the receiver according to the invention.

In the embodiment of the receiver according to the invention shown in FIG. 12, the FM receiver comprising the above-illustrated circuits has the configuration of a VHF-FM automobile radio 120 including two connected loudspeakers 121 and 122.

The following considerations apply for the interaction of the various circuits to change the processing channel in the described receiving system:

The adjacent channel detection evaluates the interference produced between the desired station and the adjacent station. This reflection has no influence on the filter states. If reflections are detected, a switch is made initially from stereo to mono, thus already eliminating the effect of many reflection interferences. If the reflection interferences are greater, such elimination is not yet sufficient. It is therefore favorable to employ an additional muting circuit. This also removes part of such reflection interferences which remain as annoying in the LF signal even if a switch is made to mono operation. Thus, in the system according to the invention, essentially two groups of control variables are at work: the first displaces the entire arrangement in its resonance position. Steep-edged filters are controlled by a highpass characteristic, more broadbanded filters, however, by a certain lowpass characteristic.

The performance capability of the disclosed receiving system will now be made clearer with the aid of several receiving situations:

At a distance of 100 kHz, an adjacent stereo station may have about 10 times the field intensity of the desired station before interference occurs (without the circuit according to the invention, interference occurs at about the same ratio of desired station to adjacent channel station).

At a distance of 200 kHz, the field intensity of an adjacent channel stereo station may lie about 30 dB higher than that at which interference would occur with a normal receiver.

If an adjacent channel station lies at a distance of 200 kHz, the gain in selectivity means that, insofar as stereo reception is involved, this gain remains in effect almost independent of the level of the adjacent channel station. The spectrum of adjacent channel stations at a distance of 200 kHz, even if they are strong, does not enter so deeply into the received channel that the highest selection stage $NK_3$ would respond at which the reception is monaural.

A gain in selectivity of 30 dB further means that, even if the desired field intensities are low, far below the stereo threshold, the takeover range for an adjacent channel station 200 kHz away is almost never reached. The adjacent channel station would have to have a field intensity higher by a factor of 30, which corresponds to a 900 times higher transmitting power, than in conventional receivers.

The improvement in receiving power becomes particularly drastic if sensitivity and selectivity are required to the same degree, for example for a desired station which in any case contains a lot of noise and there are simultaneously strong adjacent channel stations. A mixture of noise and distorted crosstalk modulations as the received product of a conventional receiver is contrasted by clear reception of the desired station in the solution according to the invention.

The improvements take place without influencing the distortion factor or the stereo crosstalk attenuation. In both full stereo states $NK_0$ and $NK_1$, the distortion factor lies below 1% for a deviation of 75 kHz and a low frequency of 1 kHz. Stereo crosstalk attenuation lies at 30 dB for 1 kHz and at 22 dB for 5 kHz.

The invention is not limited in its embodiment to the above-mentioned exemplary preferred embodiment. Rather, a number of variations are conceivable which employ the disclosed solution also for basically different types of configurations. In particular, the configuration is not limited to a realization by means of discrete logic components; rather, it can advantageously also be realized with programmed logic systems—preferably by employing a microprocessor.

I claim:

1. An improved FM receiver which includes an IF unit having a plurality of stages of an LF unit having a plurality of stages, the IF unit including a relatively narrowbanded IF filter having a controllable center frequency and the LF unit providing at least one audio frequency output signal, wherein the improvement comprises:

at least one stage of the IF unit has a control input port and at least one stage of the LF unit has a control input port; and the FM receiver additionally includes a transmission characteristic change means for changing a signal transmission characteristic of at least one of the IF and LF units, said transmission characteristic change means comprising a signal detector module (28) including detector circuits (29 to 33) for detecting values characteristic of receiving or interference states, with said detector circuits having inputs which are each connected with a stage of the IF or LF unit, and with said signal detector module having outputs for signals characteristic of receiving or interference states, respectively; and evaluation means (400, 600) for generating processed signals characteristic of receiving or interference states, respectively, as control signals to influence the signal transmission characteristic of at least one of the IF and LF units, with inputs of the evaluation means being connected with outputs of the signal detector module and the outputs of the evaluation means being connected with control input ports of stages of the IF and LF units, wherein the evaluation means includes timer means (700) for increasing the duration of at least one of the signals which is output by the detector module during an interference state until reception has improved for a predetermined minimum time-span.

2. An FM receiver according to claim 1, wherein the timer means comprises a first bistable element (702) which is connected to a respective one of said detector circuits and which, at the onset of an output signal from the respective detector circuit, is put into a first condition in which it emits a control signal, the first bistable element being switched to a second condition if a certain time-span has elapsed without an output signal from the respective detector circuit.

3. An FM receiver according to claim 2, wherein the timer means further comprises a second bistable element (703) which is responsive to the output signal from the respective detector circuit.

4. An FM receiver according to claim 3, wherein the first bistable element is switched to its second condition if the second bistable element has not received an output signal from the respective detector circuit by the end of the time-span.

5. An FM receiver according to claim 4, wherein the beginning and the end of the time-span are defined by one of two alternating beat signals given at differing times.

6. An FM receiver according to claim 3, wherein the timer means comprises a plurality of timer circuits, each connected to a respective one of said detector circuits, and means for generating alternating beat signals which are conveyed at differing times to each of the timer circuits.

7. An FM receiver according to claim 1, wherein means includes a circuit which produces regular beat impulses.

8. An FM receiver according to claim 7, wherein the circuit which produces regular beat impulses comprises a multivibrator having an output signal with edges, and means for generating pulses from the edges of the output signal of the multivibrator.

9. An FM receiver according to claim 1, wherein the timer means comprises a plurality of timer circuits, each connected to a respective one of said detector circuits, and wherein the evaluation means further comprises a signal linkage unit to generate the control signals by way of at least one of a logic and time-dependent linkage of signals outputted by the timer circuits, the signal linkage unit including logic units which generate the control signals in accordance with a truth table.

10. An FM receiver according to claim 1, wherein:
the stages of the LF unit include a stereo decoder having a control input port which receives a control signal from the evaluation means; and
the stages of the IF unit include
a demodulator having an input port and having an output port that is connected to the LF unit,
control module means, having an input port that is connected to the output port of the demodulator, for generating follow-up signals, the control module means having at least one control input port which receives a control signal from the evaluation means,
input means for receiving a first IF signal,
means for filtering the first IF signal to provide a filtered signal, the means for filtering receiving a follow-up signal generated by the control module means,
frequency converter means for converting the filtered signal to a second IF signal having a lower frequency than the first IF signal, the frequency converter means receiving a follow-up signal generated by the control module means,
means for bandpass filtering and attenuating the second IF signal to provide an adjusted IF signal, the means for bandpass filtering and attenuating having at least one control input port which receives a control signal from the evaluation means, and
parallel path means for conveying the adjusted IF signal from the means for bandpass filtering and attenuating to the input port of the demodulator, the parallel path means including a linear path portion having a switch with a control input port which receives a control signal from the evaluation means, and a filtered path portion having at least one tracking filter and a switch with a control input port which receives a signal from the evaluation means, the at least one tracking filter of the filtered path portion receiving a follow-up signal generated by the control module means and additionally having a control input port which receives a control signal from the evaluation means.

11. An FM receiver according to claim 10, wherein the receiving or interference stages include adjacent channel interferences and, in the case of adjacent channel interferences, the control signals generated by the evaluation means and the follow-up signals generated by the control module means cause the IF unit to be switchable in at least one step so as to become more narrowbanded;
the transmission characteristic of the IF unit has channel limits and, in the case of a first IF signal with a low input signal level, the control signals generated by the evaluation means and the follow-up signals generated by the control module means cause the transmission characteristic of the IF unit to have a peak transmission region between the channel limits and, on both sides of the peak transmission region, to have a steep symmetrical drop followed by shoulder-like regions which have a less extensive drop toward the channel limits; and
in the case of a first IF signal below a very low input signal level, the control signals generated by the evaluation means and the follow-up signals generated by the control module means cause the level of the audio frequency output signal to be reduced, with short-term signal breaks producing an undelayed drop in the audio frequency output signal level.

12. An FM receiver according to claim 10, wherein the FM receiver is tunable to a desired channel, and wherein the control module means comprises means for reducing the frequency response of the IF unit as a function of the ratio of the level of a signal in a channel adjacent to the desired channel, to the level of a signal in the desired channel.

13. An FM receiver according to claim 10, wherein one of said detector circuits includes a switching stage (114, 116) which has hysteresis.

14. An FM receiver according to claim 10, wherein the signals output by the detector module include first, second, third, and fourth detector module signals having durations which depend on receiving conditions, wherein the timer means comprises means for increasing the duration of the first, second, and fourth detector module signals to provide modified first, second, and fourth detector module signals, and wherein the evaluation means further comprises a logic switching circuit (601 to 606) which receives the third detector module signal and the modified first, second, and fourth detector module signals, the logic circuit including means for AND-ing the modified first and second detector module signals to provide a first AND-ed signal, means for AND-ing the modified first, second, and fourth detector module signals to provide a second AND-ed signal, and at least one gate which is responsive to the third detector module signal and to the first and second AND-ed signals.

15. An FM receiver according to claim 10, wherein the IF unit has an IF transmission bandwidth, and
wherein the control signals generated by the evaluation means include control signals which selectively initiate a reduction of the IF transmission bandwidth.

16. An FM receiver according to claim 1, wherein the stages of the IF unit include means for compensating for a reduction in the amplitude of an IF signal if the IF signal is attenuated as a result of a corresponding control signal.

17. An FM receiver according to claim 7, wherein said circuit which produces regular beat impulses is an astable multivibrator.

18. An FM receiver according to claim 1, wherein the stages of the IF unit include means for bandpass filtering an IF signal to provide a bandpass-filtered IF signal, means for rectifying the bandpass-filtered IF signal to provide a rectified signal, means for integrating the rectified signal to provide an integrated signal, and a demodulator which generates a demodulated signal, the rectified signal, integrated signal, and demodulated signal serving as input signals for the detector circuits of the detector module.

19. An FM receiver having an input port for an IF signal, comprising:
   a demodulator having an input port and an output port;
   IF transmission path means for defining a transmission path for he IF signal from the input port of the receiver to the input port of the demodulator, the IF transmission path means including a filter through which the IF signal flows, the filter having filter characteristics;
   a low frequency portion having an input port that is connected to the output port of the demodulator, the low frequency portion carrying a demodulated signal; and
   filter control means for controlling the filter characteristics in accordance with receiving conditions, the filter control means being responsive to the demodulated signal and to the IF signal carried by the transmission path, the filter control means including timer means for determining when receiving conditions have remained in an improved state for at least a predetermined minimum time-span in order to suppress frequent changes in the filter characteristics during rapidly changing receiving conditions, the timer means including means for generating first and second pulse trains with the same frequency but different phases.

20. The FM receiver of claim 19, wherein the IF transmission path means further comprises an additional filter through which the IF signal flows, the additional filter having filter characteristics, and wherein the filter control means further comprises means for controlling the filter characteristics of the additional filter.

21. The FM receiver of claim 20, wherein the IF transmission path means additionally includes a first switching stage, a second switching stage, and a further filter having filter characteristics, wherein the transmission path has an initial portion which is connected to the input port of the receiver and a final portion which connects the initial portion to the input port of the demodulator, the final portion of the transmission path having first and second branches, wherein the filter and the additional filter are in the initial portion of the transmission path, wherein the first switching stage is in the first branch of the final portion of the transmission path, wherein the further filter and the second switching stage are connected in series in the second branch of the final portion of the transmission path, and wherein the filter control means further comprises means for controlling the filter characteristics of the further filter and for selectively closing the first and second switching stages.

22. The FM receiver of claim 21, wherein the filter control means comprises means for rectifying the IF signal to provide a rectified signal, means for integrating the rectified signal to provide an integrated signal, and a detector module which receives the rectified and integrated signals, the detector module including means for detecting a weak signal and means for detecting interference from adjacent channels.

23. The FM receiver of claim 22, wherein the detector module additionally receives the demodulated signal, and wherein the detector module further comprises means for detecting takeover by an adjacent channel.

24. The FM receiver of claim 23, wherein the filter control means further comprises an evaluation means, connected to the detector module, for generating plurality of control signals, the first and second switching stages and at least one of the filters being responsive to respective control signals form the evaluation means.

25. The FM receiver of claim 24, wherein the filter control means further comprises a control module which receives the demodulated signal and which includes third and fourth switching stages, the third and fourth switching stages being selectively closed by respective control signals from the evaluation means.

26. The FM receiver of claim 24, wherein the low frequency portion comprises a first correction filter having an output port, a second correction filter having an output port and having an input port that is connected to the output port of the first correction filter, and a further switching stage that selects the output port of the first correction filter or the output port of the second correction filter in response to a respective control signal from the evaluation means.

27. The FM receiver of claim 26, wherein the low frequency portion further comprises a muting circuit, and wherein the receiver further comprises means responsive to the rectified signal for controlling the muting circuit.

28. The FM receiver of claim 27, wherein the low frequency portion further comprises a stereo decoder which is connected to the muting circuit and which is controlled by a respective control signal from the evaluation means.

29. The FM receiver of claim 19, wherein the timer means further comprises a first flip-flop which receives a timer input signal and the first pulse train, a second flip-flop which receives the timer input signal and a gate having an output that is connected to the second flip-flop, the gate additionally having a first input that is connected to the first flip-flop and a second input that receives the second pulse train.

* * * * *